United States Patent
Kato et al.

(10) Patent No.: US 11,075,074 B2
(45) Date of Patent: Jul. 27, 2021

(54) METHOD FOR DEPOSITING A SILICON NITRIDE FILM AND FILM DEPOSITION APPARATUS

(71) Applicant: Tokyo Electron Limited, Tokyo (JP)

(72) Inventors: Hitoshi Kato, Iwate (JP); Yutaka Takahashi, Iwate (JP); Kazumi Kubo, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 252 days.

(21) Appl. No.: 16/057,125

(22) Filed: Aug. 7, 2018

(65) Prior Publication Data

US 2019/0051512 A1 Feb. 14, 2019

(30) Foreign Application Priority Data

Aug. 9, 2017 (JP) ............... JP2017-154742

(51) Int. Cl.
*H01L 21/02* (2006.01)
*C23C 16/34* (2006.01)
(Continued)

(52) U.S. Cl.
CPC ........ *H01L 21/0217* (2013.01); *C23C 16/045* (2013.01); *C23C 16/345* (2013.01); *C23C 16/452* (2013.01); *C23C 16/4554* (2013.01); *C23C 16/4584* (2013.01); *C23C 16/45534* (2013.01); *C23C 16/45536* (2013.01); *C23C 16/45551* (2013.01); *C23C 16/45559* (2013.01); *H01J 37/32* (2013.01); *H01J 37/321* (2013.01);
(Continued)

(58) Field of Classification Search
CPC ............ C23C 16/045; C23C 16/45534; C23C 16/45551; C23C 16/452; C23C 16/45536; C23C 16/345; C23C 16/45559; C23C 16/4584; C23C 16/4554; H01L 21/0217; H01L 21/0228; H01L 21/02211; H01L 21/02274; H01L 21/68764; H01L 21/68771; H01L 21/76831; H01J 37/32; H01J 37/321; H01J 37/32449; H01J 37/32715; H01J 2237/3321; H01J 2237/20214; H01J 37/32651; H01J 37/32724; H01J 37/32513; H01J 37/32733
USPC ............................ 427/248.1–255.7
See application file for complete search history.

(56) References Cited

U.S. PATENT DOCUMENTS

| | | | |
|---|---|---|---|
| 2014/0021458 A1* | 1/2014 | Tada et al | H01L 51/5012 257/40 |
| 2017/0125238 A1* | 5/2017 | Hasebe | H01L 21/0228 |
| 2018/0237912 A1* | 8/2018 | Takahashi et al. | H01L 21/0228 |

FOREIGN PATENT DOCUMENTS

| | | |
|---|---|---|
| JP | 2014-532304 | 12/2014 |
| JP | 2017-011136 | 1/2017 |

(Continued)

*Primary Examiner* — Michael P Wieczorek
*Assistant Examiner* — Michael G Miller
(74) *Attorney, Agent, or Firm* — IPUSA, PLLC

(57) ABSTRACT

A method for depositing a silicon nitride film is provided to fill a recessed pattern formed in a surface of a substrate with a silicon nitride film. In the method, a first silicon nitride film is deposited in the recessed pattern formed in the surface of the substrate. The first silicon nitride film has a V-shaped cross section decreasing its film thickness upward from a bottom portion of the recessed pattern. A second silicon nitride film conformal to a surface shape of the first silicon nitride film is deposited.

19 Claims, 16 Drawing Sheets

(51) Int. Cl.
    *C23C 16/455*     (2006.01)
    *C23C 16/458*     (2006.01)
    *H01L 21/687*     (2006.01)
    *H01J 37/32*     (2006.01)
    *H01L 21/768*     (2006.01)
    *C23C 16/04*     (2006.01)
    *C23C 16/452*     (2006.01)

(52) U.S. Cl.
    CPC .. *H01J 37/32449* (2013.01); *H01J 37/32715* (2013.01); *H01L 21/0228* (2013.01); *H01L 21/02211* (2013.01); *H01L 21/02274* (2013.01); *H01L 21/68764* (2013.01); *H01L 21/68771* (2013.01); *H01L 21/76831* (2013.01); *H01J 2237/20214* (2013.01); *H01J 2237/3321* (2013.01)

(56) References Cited

FOREIGN PATENT DOCUMENTS

| | | |
|---|---|---|
| JP | 2017-069407 | 4/2017 |
| JP | 2017-092098 | 5/2017 |
| JP | 2017-112258 | 6/2017 |

* cited by examiner

METHOD FOR DEPOSITING A SILICON NITRIDE FILM AND FILM DEPOSITION APPARATUS

CROSS-REFERENCE TO RELATED APPLICATION

The present application is based on Japanese Priority Application No. 2017-154742 filed on Aug. 9, 2017, the entire contents of which are hereby incorporated herein by reference.

BACKGROUND OF THE INVENTION

1. Field of the Invention

The present invention relates to a method for depositing a silicon nitride film and a film deposition apparatus.

2. Description of the Related Art

Conventionally, as disclosed in Japanese Laid-Open Patent Application Publication No. 2017-92098, a method for depositing a silicon nitride film in a fine recess is known that repeats a process of adsorbing a film deposition source gas that contains an element constituted of a nitride film to be deposited and chloride, and a process of nitriding the adsorbed film deposition source gas using nitriding active species. In the nitriding process, NH* active species and N* active species are generated as the nitriding active species, and a region on which the film deposition source gas adsorbs is changed by controlling a concentration of the NH* active species and the N* active species in the fine recess.

The method for depositing the nitride film performs an initial film deposition stage that forms a conformal nitriding film by performing a nitriding process mainly using the NH* active species prior to a film deposition process, and then performs a film deposition stage in which a concentration of the N* active species is continuously decreased from a high concentration state of the N* active species and a nitride film is deposited from a trench bottom in a nitriding process. Thus, a nitride film is deposited by bottom-up growth from the trench bottom, and then a conformal film is deposited with the high NH* active species, thereby depositing a nitride film without forming a void or a seam in the fine trench.

However, because the method for depositing the nitride film described in Japanese Laid-Open Patent Application Publication No. 2017-92098 needs to change the concentration of the NH* active species and the N* active species in accordance with a stage of the film deposition, supply control of the gas during the film deposition may be difficult.

Moreover, when a filling deposition is performed by the bottom-up growth, a film is deposited thickly on a bottom portion, whereas the film is thinly deposited on an upper portion of a recess. Thus, when the film is modified with plasma, the upper portion of the film is sufficiently modified, whereas the bottom portion of the film may be insufficiently modified, which is liable to decrease the film quality.

Therefore, one embodiment of the present disclosure is intended to provide a method for depositing a silicon nitride film and film deposition apparats that can fill a recessed pattern with a high-quality film.

SUMMARY OF THE INVENTION

The present invention is made in light of the above problems, and provides a film deposition method and film deposition apparatus that can fill a recess with a nitriding film with high bottom-up properties by using a simple process and apparatus.

According to an embodiment, there is provided a method for depositing a silicon nitride film to fill a recessed pattern formed in a surface of a substrate with a silicon nitride film. In the method, a first silicon nitride film is deposited in the recessed pattern formed in the surface of the substrate. The first silicon nitride film has a V-shaped cross section decreasing its film thickness upward from a bottom portion of the recessed pattern. A second silicon nitride film conformal to a surface shape of the first silicon nitride film is deposited.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present disclosure are described below with reference to the accompanying drawings.

[Film Deposition Apparatus]

Figure 1:
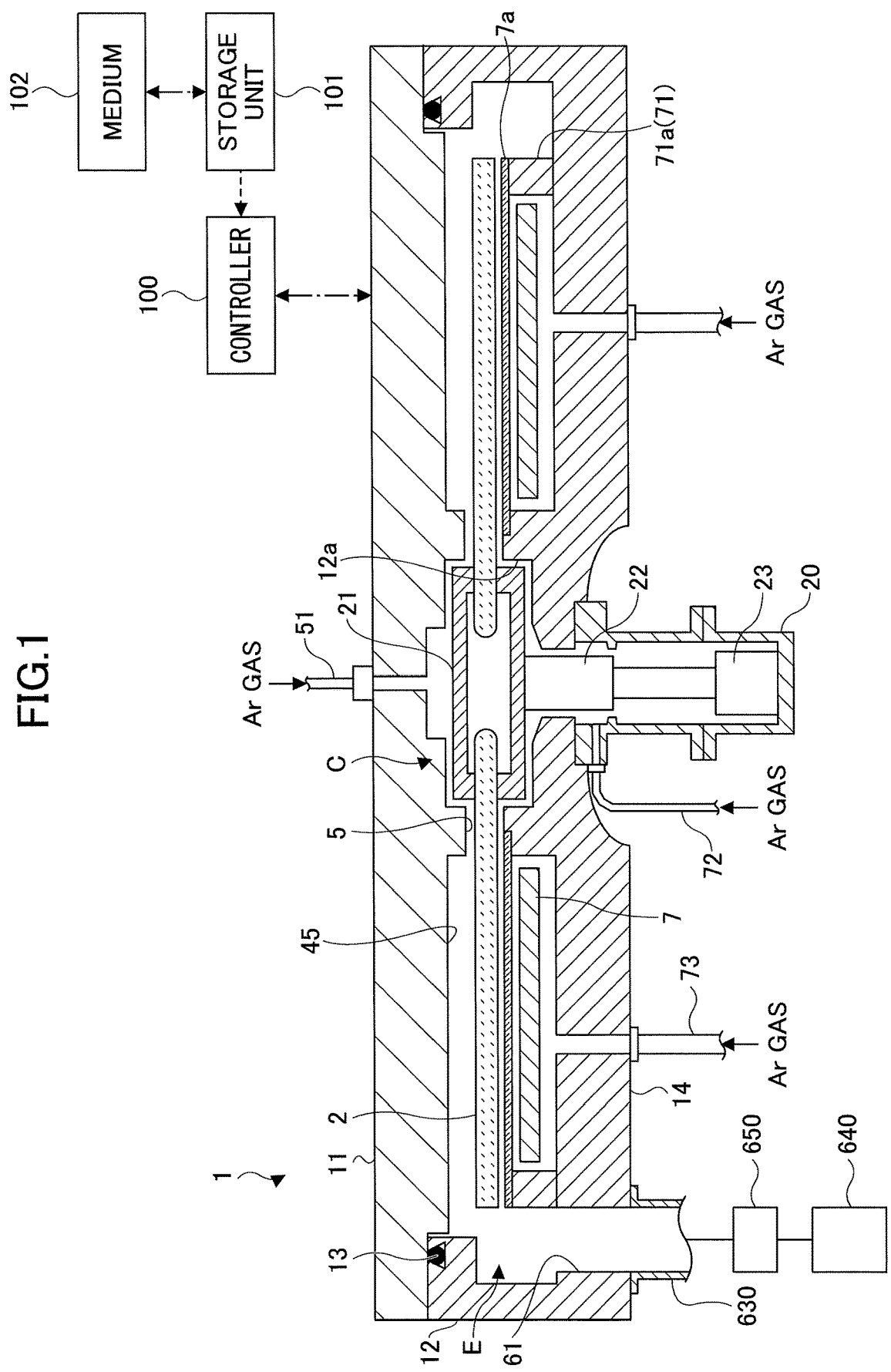
FIG. 1 is a schematic cross-sectional view illustrating a film deposition apparatus according to an embodiment of the present disclosure.
Figure 2:
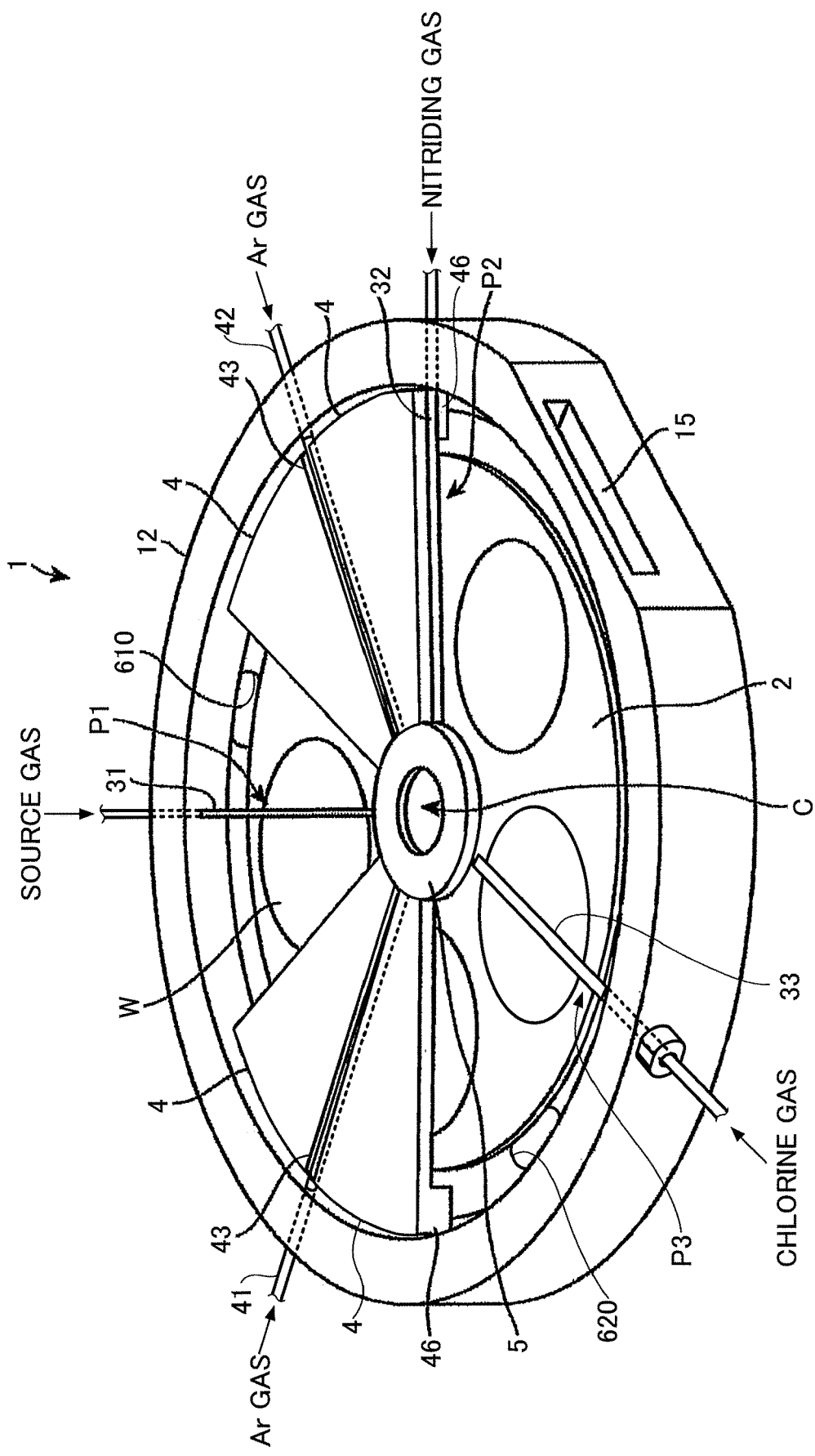
FIG. 2 is a schematic perspective view illustrating an inner structure of a vacuum chamber of a film deposition apparatus according to an embodiment of the present disclosure.
Figure 3:
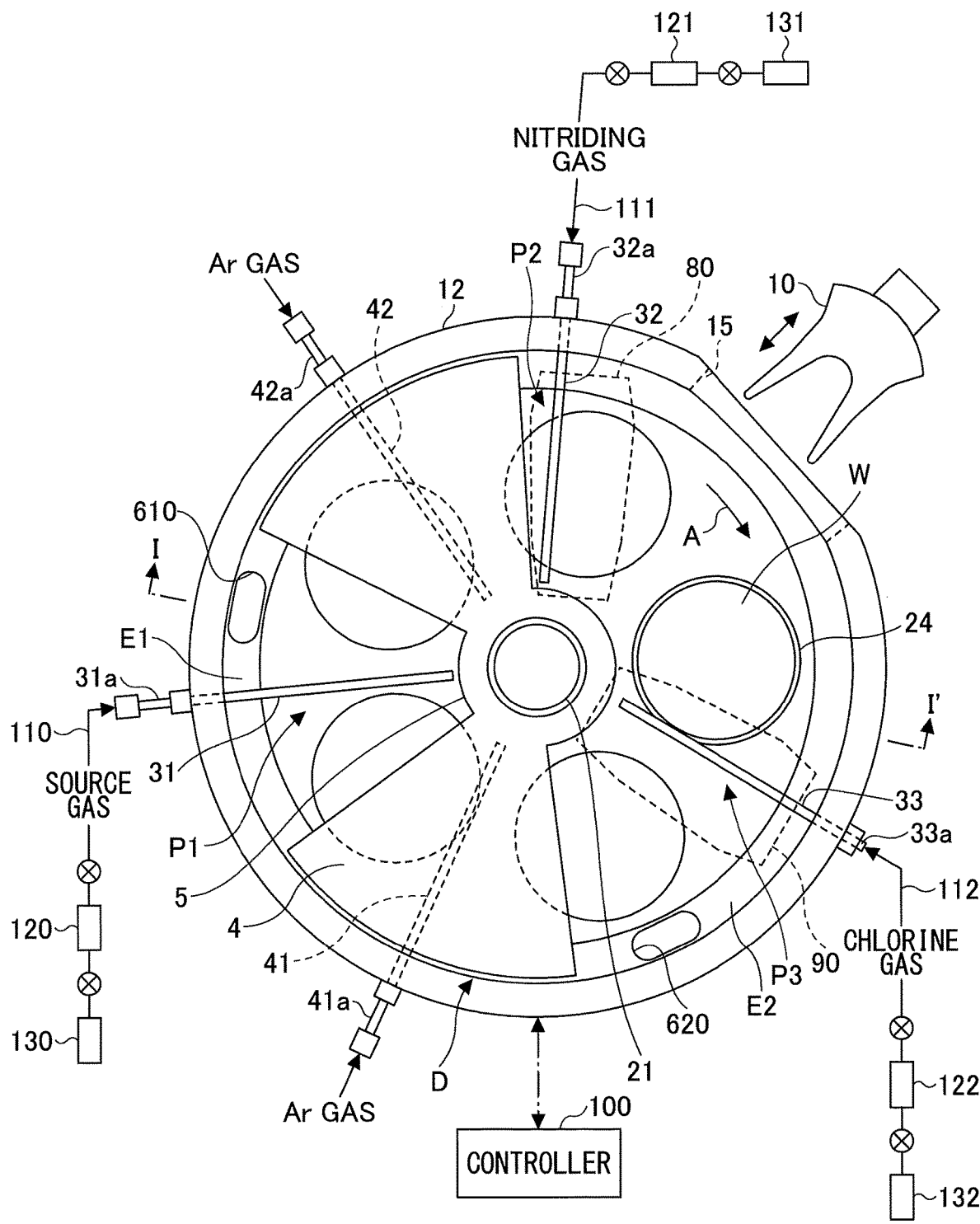
FIG. 3 is a schematic top view illustrating an inner structure of a vacuum chamber of a film deposition apparatus according to an embodiment of the present disclosure.

To begin with, a film deposition apparatus according to an embodiment of the present disclosure is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to accommodate a wafer therein and to deposit a film on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate through a bottom portion 14 of the vacuum chamber 1, and the lower end of the rotary shaft 22 is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from external atmosphere.

As illustrated in FIGS. 2 and 3, a plurality of (five in the example of the drawing) circular concave portions 24 is provided in a top surface of the turntable 2 along a rotating direction (circumferential direction) to receive the plurality of semiconductor wafers (which will be simply referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that (for example, 300 mm) of the wafer W, and to have a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate.

FIGS. 2 and 3 are diagrams for explaining an inner structure of the vacuum chamber 1. The ceiling plate 11 is not illustrated in FIGS. 2 and 3 for an explanatory purpose.

As illustrated in FIGS. 2 and 3, a reaction gas nozzle 31, a reaction gas nozzle 32, a reaction gas nozzle 33, and separation gas nozzles 41 and 42, which are made of quartz, for example, are provided above the turntable 2. In the example illustrated in FIG. 3, the reaction gas nozzle 33, the separation gas nozzle 41, the reaction gas nozzle 31, the separation gas nozzle 42, and the reaction gas nozzle 32 are arranged in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 so as to extend in a radial direction and parallel to the surface of the turntable 2.

In this embodiment, as illustrated in FIG. 3, the reaction gas nozzle 31 is connected to a supply source 130 (not illustrated in the drawings) of a source gas via a pipe 110, a flow controller 120 and the like (not illustrated in the drawings). The reaction gas nozzle 32 is connected to a supply source 131 (not illustrated in the drawings) of a nitriding gas via a pipe 111, a flow controller 121 and the like (not illustrated in the drawings). The reaction gas nozzle 33 is connected to a supply source 132 (not illustrated in the drawings) of chlorine ($Cl_2$) gas via a pipe 112, a flow controller 122 and the like (not illustrated in the drawings). The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen ($N_2$) gas can be used as the separation gas. The present embodiment is described by citing an example of using Ar gas as the separation gas.

Each of the reaction gas nozzles 31, 32 and 33 has a plurality of gas discharge holes 35 that faces downward to the turntable 2 along the longitudinal directions of each of the reaction gas nozzles 31, 32 and 33 at intervals of 10 mm, for example. A region below the reaction gas nozzle 31 is a first process region P1 in which the source gas adsorbs on the wafers W. A region below the reaction gas nozzle 32 is a second process region P2 in which the nitriding gas that nitrides the source gas adsorbed on the wafer W is supplied, thereby producing a molecular layer of a nitride. The molecular layer of the nitride constitutes a film to be deposited. A region below the reaction gas nozzle 33 is a third process region P3 in which chlorine gas activated by plasma is supplied to the reaction product (nitride film) produced in the second process region P2, thereby forming an adsorption blocking group. Here, because the first process region P1 is a region where the source gas is suppled, the first process region P1 may be referred to as a source gas supply region P1. Similarly, because the second process region P2 is a region where the nitriding gas that reacts with the source gas and produces the nitride is supplied, the second process region P2 may be referred to as a nitriding gas supply region P2. Also, the third process region P3 is a region where chlorine gas is supplied, the third process region P3 may be referred to as a chlorine gas supply region P3.

A plasma generator 90 is provided around the third process region, for example, over or laterally to the third process region P3. A plasma generator 80 is also provided over the second process region P2. In FIG. 3, the plasma generators 80 and 90 are simply illustrated by a dotted line for an explanatory purpose. The plasma generator 90 is constituted of a remote plasma generator to generate chlorine radicals. In contrast, a type of the plasma generator 80 is not particularly limited, and for example, the plasma generator 80 may be constituted of an ICP (Inductively Coupled Plasma) plasma generator. Details of the plasma generators 80 and 90 will be described below.

A gas that contains silicon and chlorine is selected as the source gas. For example, when a silicon nitride (SiN) film is deposited, a gas that contains silicon and chlorine such as dichlorosilane (DCS, $SiH_2Cl_2$) is selected. Here, a variety of gases may be used as the source gas as long as the source gas contains silicon and chlorine. For example, in addition to dichlorosilane, another chlorosilane-based gas such as monochlorosilane ($SiH_3Cl$), trichlorosilane ($SiHCl_3$), hexachlorodisilane ($Si_2Cl_6$) may be used depending on the intended use. DCS is cited as an example of such a gas that contains silicon and chlorine.

In general, ammonia ($NH_3$) containing gas is selected as the nitriding gas. A nitrogen ($N_2$) containing gas may be selected when the nitriding gas is supplied while being activated by plasma other than ammonia gas. Here, the nitriding gas may contain a carrier gas such as Ar in addition to ammonia.

Chlorine gas supplied from the third reaction gas nozzle 33 serves to form on a surface of a wafer W an adsorption blocking group that blocks the source gas supplied from the first reaction gas nozzle 31 from adsorbing on the surface of the wafer W. The film deposition apparatus and the method for depositing the silicon nitride film according to the embodiment forms the adsorption blocking region in a wide area, and controls so that the source gas uniformly adsorbs on the surface of the wafer W. Here, the method for depositing the silicon nitride film will be described in detail below. Moreover, FIGS. 2 and 3 illustrate the horizontally extending nozzle as the third reaction nozzle 33, but the third reaction gas nozzle 33 may be formed as a showerhead. In FIGS. 2 and 3, an example of forming the third reaction gas nozzle 33 as the horizontally extending nozzle is described, and an example of forming the third reaction gas nozzle 33 as a showerhead will be described below.

Referring to FIGS. 2 and 3, the ceiling plate 11 includes two convex portions 4 in the vacuum chamber 1. As will be explained below, the convex portions 4 are attached to a lower surface of the ceiling plate 11 so as to protrude toward the turntable 2 to form separation regions D with the corresponding separation gas nozzles 41 and 42. Each of the convex portions 4 has substantially a fan-like planar shape where the apex is removed in an arc shape. For each of the convex portions 4, the inner arc shaped portion is connected to a protruding portion 5 (which will be explained below) and the outer arc shaped portion is formed to extend along an inner peripheral surface of the chamber body 12 of the vacuum chamber 1.

Figure 4:
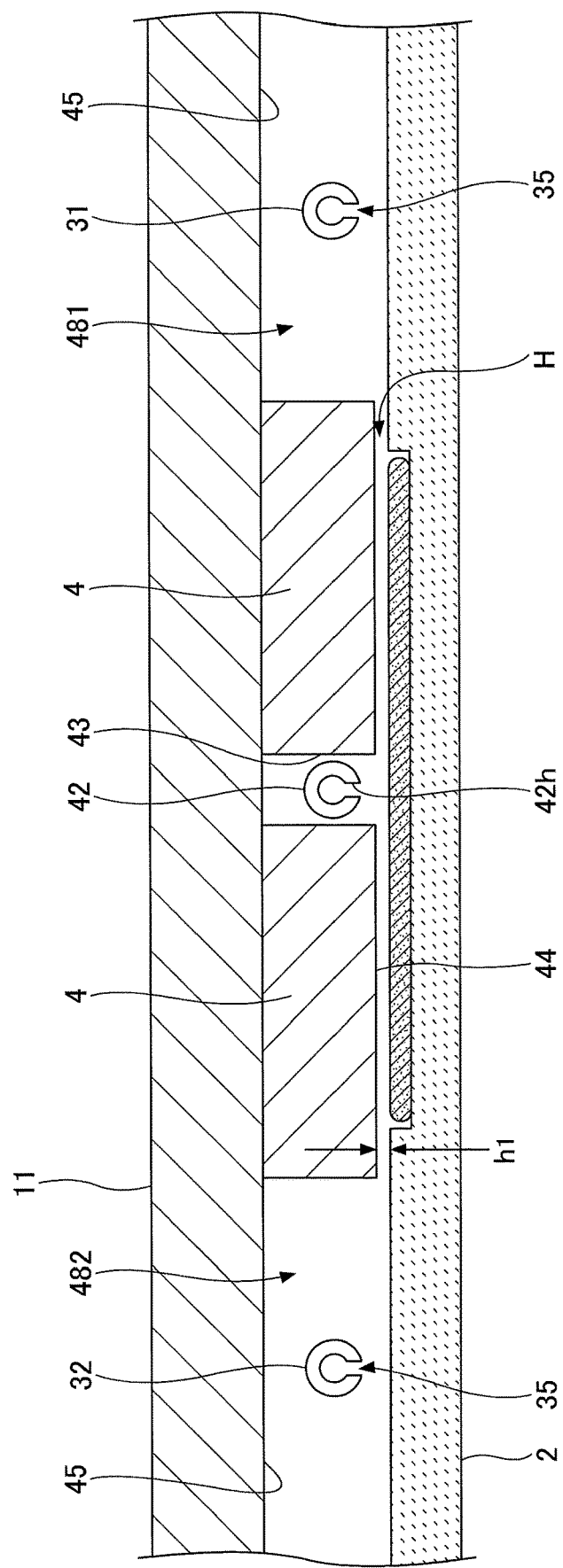
FIG. 4 is a schematic partial cross-sectional view of a vacuum chamber of a film deposition apparatus according to an embodiment of the present disclosure taken along a concentric circle of a turntable.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, the vacuum chamber 1 includes a flat low ceiling surface 44 (first ceiling surface) formed as the lower surface of the convex portion 4, and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like planar shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, the reaction gas nozzle 31 is provided in a space 481 below and on the right side of the high ceiling surface 45, and the reaction gas nozzle 32 is provided in a space 482 below and on the left side of the high ceiling surface 45.

Each of the separation gas nozzles 41 and 42 has a plurality of gas discharge holes 42h (see FIG. 4) formed along the longitudinal direction thereof at a predetermined interval (10 mm, for example).

The low ceiling surface 44 provides a separation space H, which is a narrow space, with respect to the turntable 2. When Ar gas is supplied from the separation gas nozzle 42 to the separation space H, this Ar gas flows toward the space 481 and the space 482 through the separation space H. On this occasion, because the volume of the separation space H is smaller than those of the spaces 481 and 482, the pressure in the separation space H can be made higher than those in the spaces 481 and 482 by Ar gas. It means that the separation space H having the higher pressure is formed between the spaces 481 and 482. Moreover, Ar gas flowing from the separation space H toward the spaces 481 and 482 serves as a counter flow against the source gas from the gas first process region P1 and the nitriding gas from the second process region P2. Thus, the source gas from the first process region P1 is separated from the nitriding gas from the second process region P2 by the separation space H. Therefore, mixing and reacting of the source gas with the nitriding gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 that supports the turntable 2. The protruding portion 5 is continuously formed with the inner portions of the convex portions 4 and has a lower surface that is formed at the same height as those of the low ceiling surfaces 44, in this embodiment.

Figure 5:
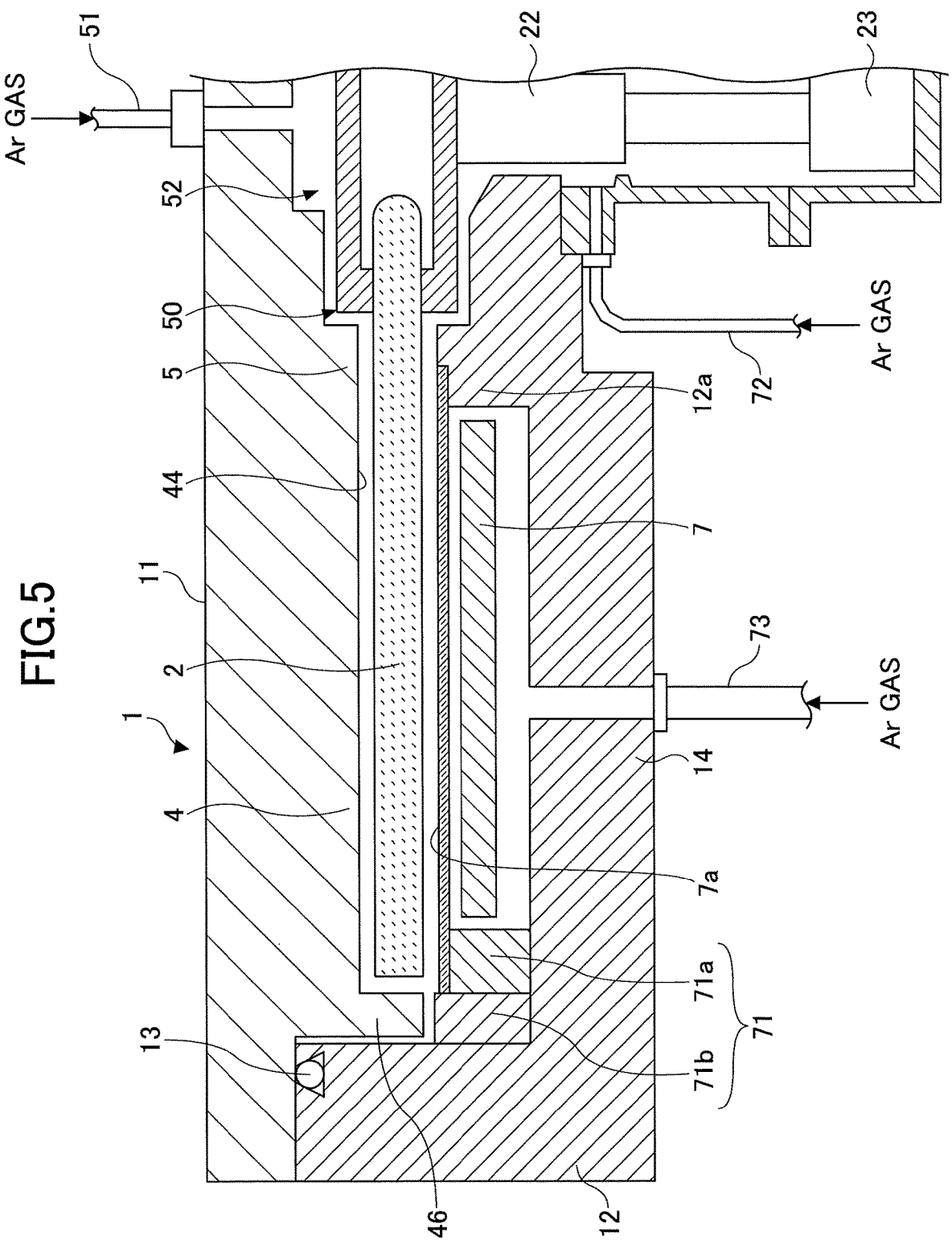
FIG. 5 is another schematic cross-sectional view of a film deposition apparatus according to an embodiment of the present disclosure.

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided. As illustrated in FIG. 5, the convex portion 4 having a substantially fan-like planar shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, a slight space is provided between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation region H. However, other than the separation region H, as illustrated in FIG. 1, for example, the inner peripheral wall of the chamber body 12 is recessed outward in a range from a location facing the outer end surface of the turntable 2 to the upper end of the bottom portion 14. Hereinafter, for an explanatory purpose, the concave portion, having a substantially rectangular cross-sectional view, is referred to as an "evacuation region." Specifically, a part of the evacuation region which is in communication with the first process region P1 is referred to as a first evacuation region E1, and a part of the evacuation region which is in communication with the second and third process regions P2 and P3 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, a pressure controller 650 is provided between the vacuum pumps 640 and the evacuation pipes 630 in FIG. 1.

As illustrated in FIGS. 2 and 3, although a separation region H is not provided between the second process region P2 and the third process region P3, as illustrated in FIG. 3, a casing that partitions a space above the turntable 2 is provided in a region illustrated as the plasma generator 80. Otherwise, when the casing is not provided for the plasma generator 80, a casing is provided for the plasma generator 80a, and the space between the second process region P2 and the third process region P3 is partitioned. This point will be described later in detail.

As illustrated in FIGS. 1 and 5, a heater unit 7, which is a heating device, is provided in a space between the bottom portion 14 of the vacuum chamber 1 and the turntable 2, and heats a wafer W on the turntable 2 via the turntable 2 up to a temperature determined by a process recipe (e.g., 400° C.). As illustrated in FIG. 5, a ring-shaped cover member 71 is provided below, at and near the periphery of the turntable 2 to prevent a gas from entering an area under the turntable 2 by separating an atmosphere from a space above the turntable 2 to the evacuation regions E1 and E2 from an atmosphere in which the heater unit 7 is placed. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. A narrow space is provided between the projecting portion 12a and the core unit 21. Furthermore, a narrow space is provided between an inner peripheral surface of the bottom portion 14 and the rotary shaft 22 to be in communication with the case body 20. A purge gas supplying pipe 72 which supplies Ar gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and is provided to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the source gas supplied to the first process region P1 and the nitriding gas supplied to the second process region P2 by flowing through the center area C can be prevented by the space 50. It means that the space 50 (or the center area C) can function similarly to the separation space H (or the separation region D).

In addition, as illustrated in FIGS. 2 and 3, a transfer port 15 is formed in a side wall of the vacuum chamber 1 for allowing the wafers W, which are substrates, to pass between an external transfer arm 10 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 10 and the concave portion 24 of the turntable 2, which is a substrate receiving area, at a location facing the transfer port 15.

Figure 6:
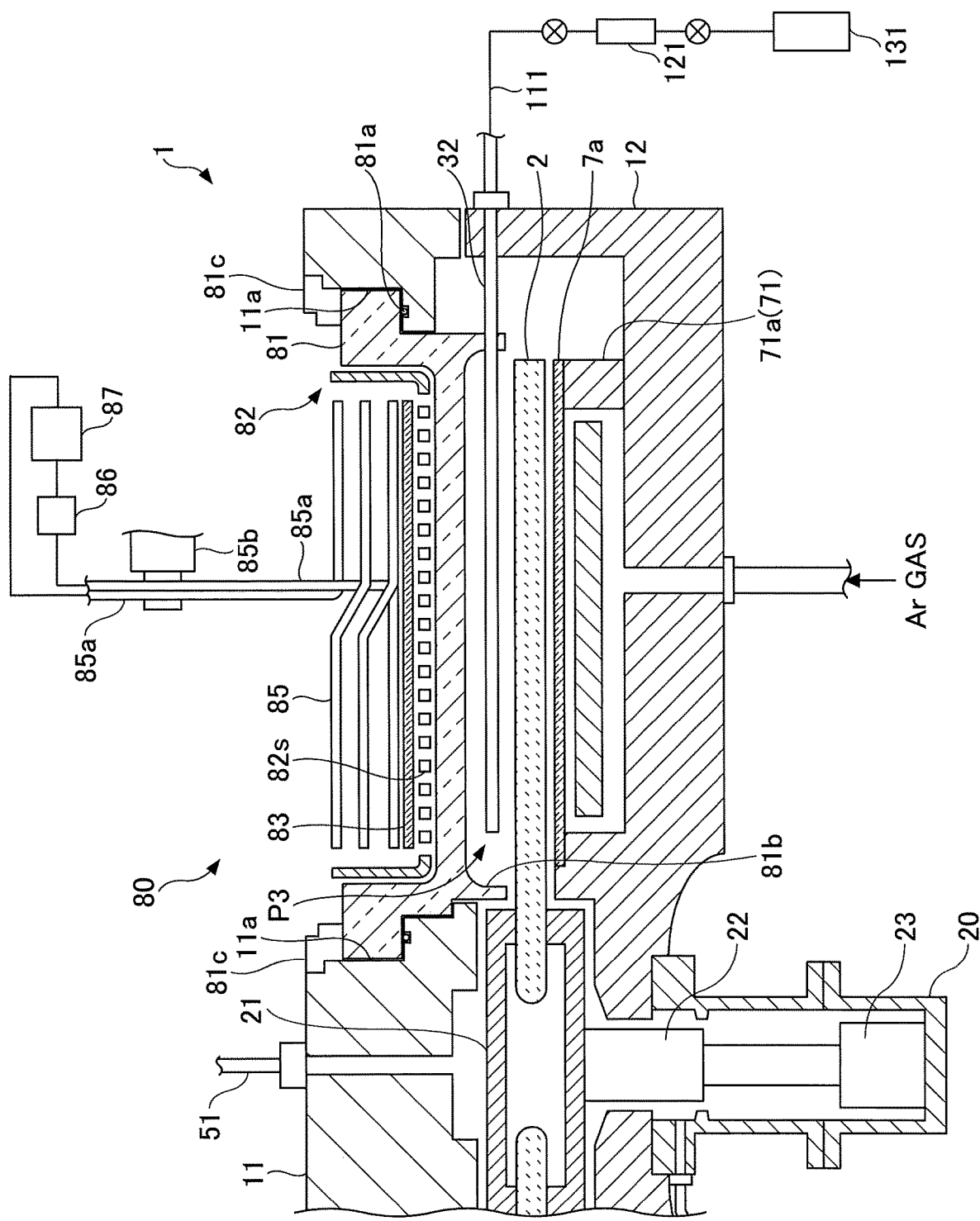
FIG. 6 is a schematic cross-sectional view of a plasma generator provided in a film deposition apparatus according to an embodiment of the present disclosure.
Figure 7:
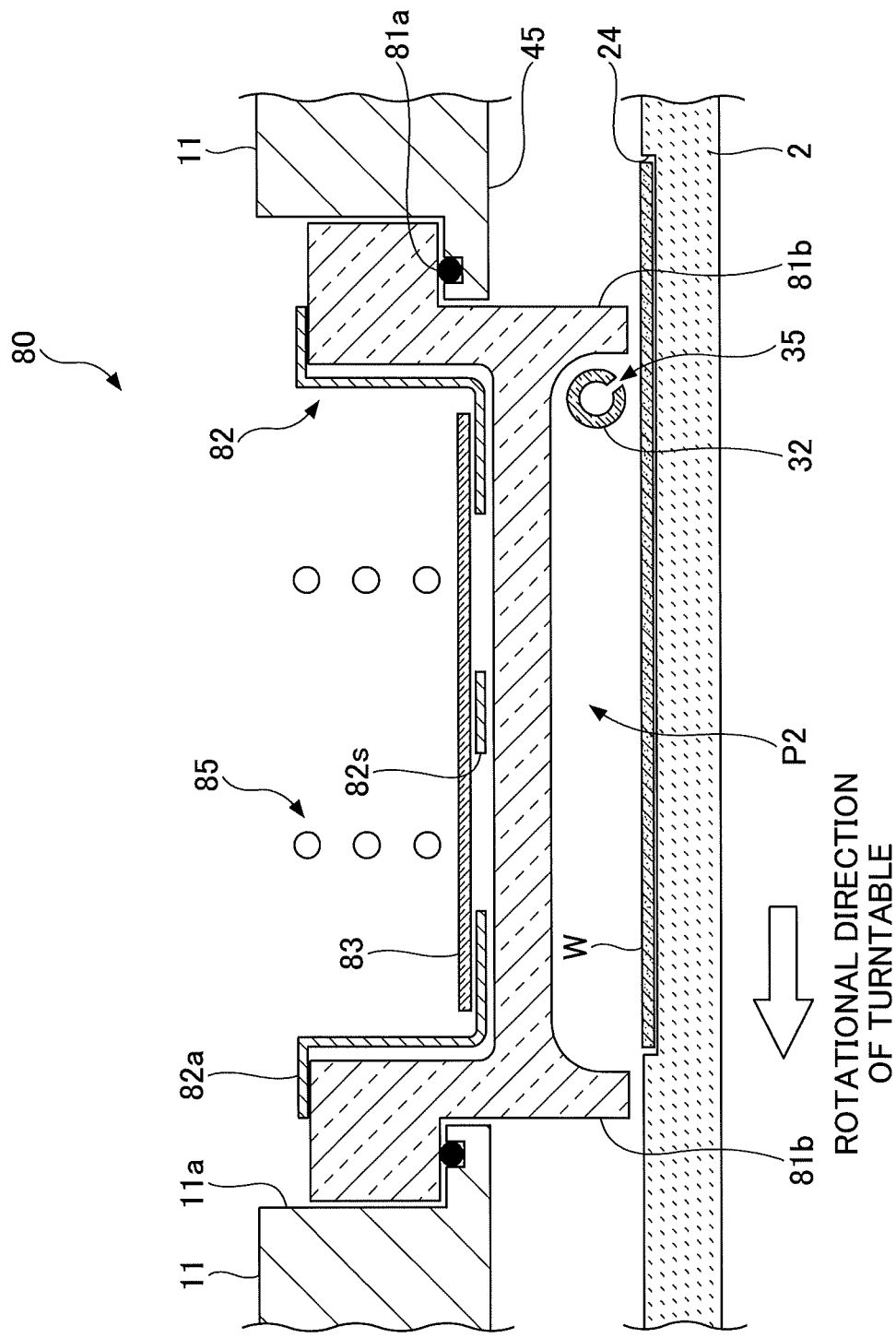
FIG. 7 is another schematic cross-sectional view of a plasma generator according to an embodiment of the present disclosure.
Figure 8:
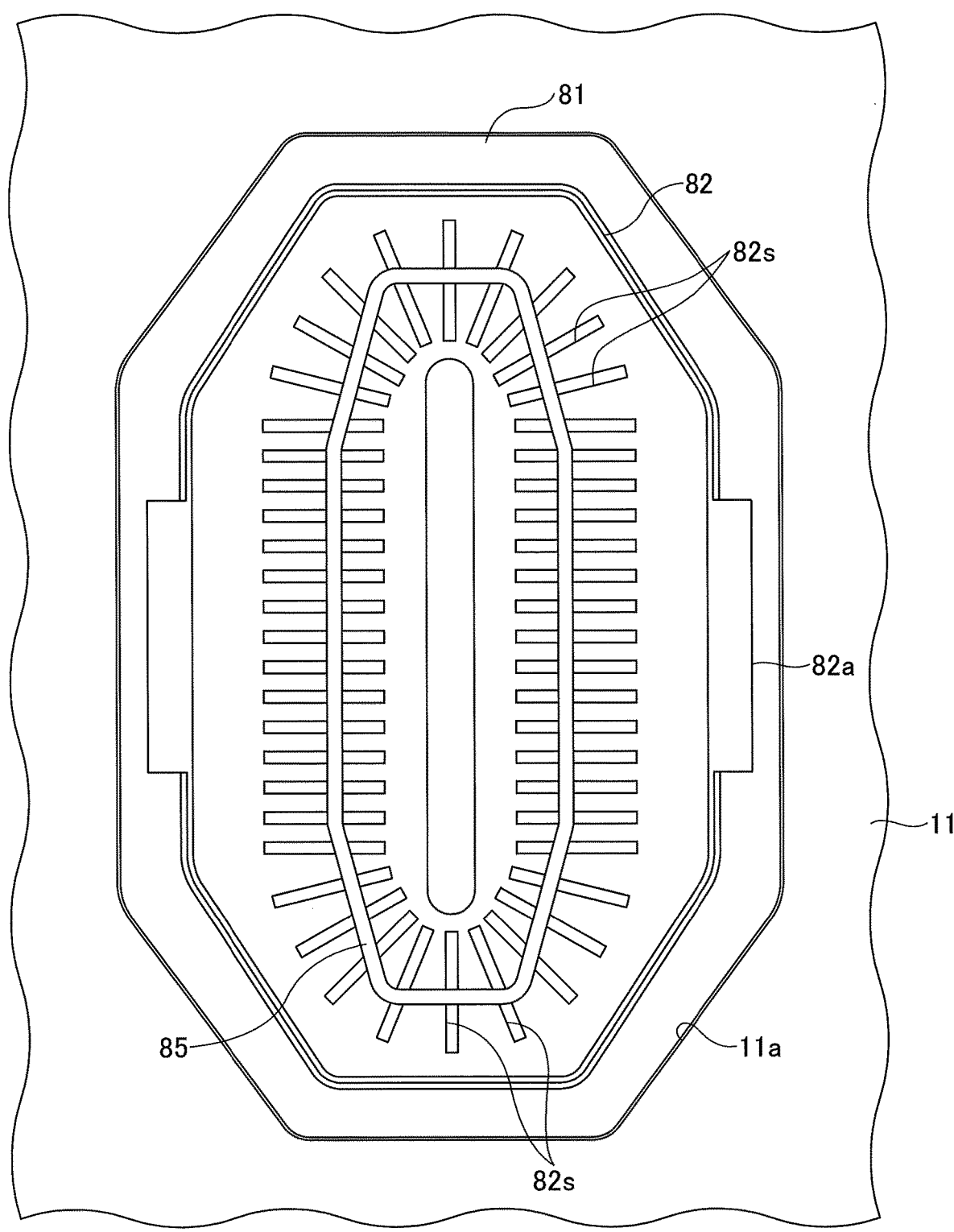
FIG. 8 is a schematic top view of a plasma generator according to an embodiment of the present disclosure.

Next, the plasma generator 80 is described below with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are simplified or not illustrated in the drawings.

Referring to FIG. 6, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal planar shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer periphery of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2 and a space (hereinafter referred to as the third process region P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

In addition, the reaction gas nozzle 32 that penetrates through the projection portion 81b is provided in the second process region P2. In this embodiment, as illustrated in FIG. 6, the nitriding gas supply source 131 filled with nitriding gas is connected to the reaction gas nozzle 32 through the pipe 111 via the flow controller 121. The nitriding gas may be, for example, a gas that contains ammonia ($NH_3$). More specifically, the nitriding gas may be a mixed gas of ammonia ($NH_3$) and argon (Ar). The nitriding gas whose flow rate is controlled by the flow controller 121 is activated by the plasma generator 80 and is supplied to the second process region P2 at a predetermined flow rate. Here, when the mixed gas of ammonia and argon is used as the nitriding gas, ammonia and argon may be separately supplied, but FIG. 6 illustrates an example of supplying ammonia and argon to the reaction gas nozzle 32 in a state of mixed gas for convenience of explanation.

The reaction gas nozzle 32 has a plurality of gas discharge holes 35 formed along the longitudinal direction thereof at a predetermined interval (10 mm, for example), and the above-mentioned chlorine gas is discharged from the gas discharge holes 35. As illustrated in FIG. 7, the gas discharge holes 35 are provided to be inclined from a vertical direction with respect to the turntable 2 toward the upstream rotational direction of the turntable 2. Due to this, the gas supplied from the reaction gas nozzle 33 is discharged in a direction opposite to the rotational direction of the turntable 2, specifically, toward a gap between a lower surface of the projection portion 81b and the surface of the turntable 2. Thus, the flows of the reaction gas and the separation gas from a space below the ceiling surface 45 that is upstream of the plasma generator 80 toward the second process region P2 along the rotation direction of the turntable 2 can be prevented. Furthermore, as described above, because the projection portion 81b that is formed along an outer periphery of the lower surface of the frame member 81 is close to the surface of the turntable 2, the pressure in the third process region can be kept high by the gas from the reaction gas nozzle 32. This also prevents the reaction gas and the separation gas from flowing into the second process region P2.

Thus, the frame member 81 plays a role in separating the second process region P2 from the surroundings. Hence, the film deposition apparatus according to the embodiment includes the frame member 81 together with the plasma generator 80 to separate the second process region P2.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s extends substantially perpendicularly to a corresponding side of the antenna 85 that has the substantially octagonal planar shape.

As illustrated in FIGS. 7 and 8, the Faraday shield plate 82 includes two support portions 82a that are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal planar shape. Thus, cooling water can be circulated in the pipe, and the antenna 85 is prevented from being heated to a high temperature by the radio frequency waves supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via the matching box 86. The radio frequency power source 87 is capable of generating radio frequency power having a frequency of 13.56 MHz, for example.

According to the plasma generator 80 thus structured, when the radio frequency power source 87 supplies the radio frequency power to the antenna 85 via the matching box 86, the antenna 85 generates an electromagnetic field. In the electromagnetic field, the Faraday shield plate 82 cuts the electric field component so as not to transmit the electric field component downward. On the other hand, the magnetic field component is transmitted into the second process region P2 through the plurality of slits 82s of the Faraday shield plate 82. The magnetic field component activates the nitriding gas supplied to the second process region P2 from the reaction gas nozzle 32 at a predetermined flow rate.

Next, the plasma generator 90 of the film deposition apparatus according to the embodiment of the present disclosure is described below.

Figure 9:
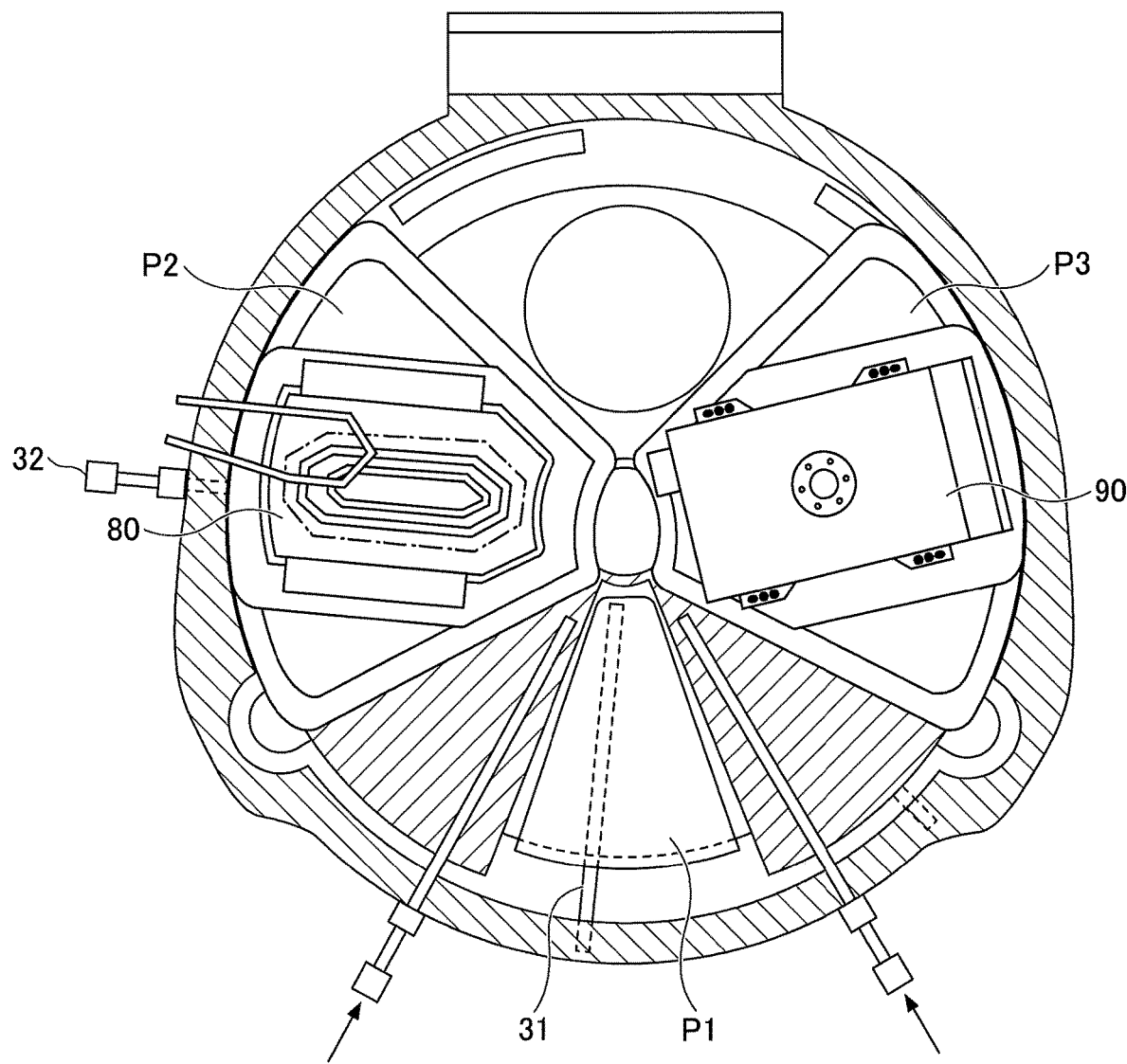
FIG. 9 is a schematic planar view illustrating an example of a film deposition method according to an embodiment of the present disclosure.

FIG. 9 is a planar view of the film deposition apparatus on which the plasma generators 80 and 90 are mounted according to the embodiment of the present disclosure. The plasma generator 90 is formed as a remote plasma generator.

The inductively coupled plasma (ICP) generator 80 using the antenna 85, which is described with reference to FIGS. 6 through 8, is effective to generate plasma with high intensity and works well when both ionized nitrogen gas and radicalized nitrogen gas may be generated. However, when chlorine ions are not needed and only chlorine radicals are needed, the remote plasma generator is more preferred to the inductively coupled plasma generator. In other words, because the remote plasma generator activates chlorine outside the vacuum chamber 1 by plasma, the ionized chlorine that has a short lifetime is inactivated before reaching the vacuum chamber 1 or the wafer W, and only the radicalized chlorine that has a long lifetime is supplied to the wafer W. Thus, the activated chlorine gas dominated by the chlorine radicals that are less activated than the ICP plasma generator that directly produces plasma in the vacuum chamber 1 can be supplied to the wafer W. A plasma generator capable of supplying the chlorine radicals and hardly supplying the ionized chlorine to the wafer W is used for the plasma generator 90 according to the embodiment. The remote plasma generator is an example of such a plasma generator. However, the plasma generator 90 is not limited to the remote plasma generator, and a variety of plasma generators can be used as long as the plasma generator can mainly generate chlorine radicals while hardly generating chlorine ions.

Figure 10:
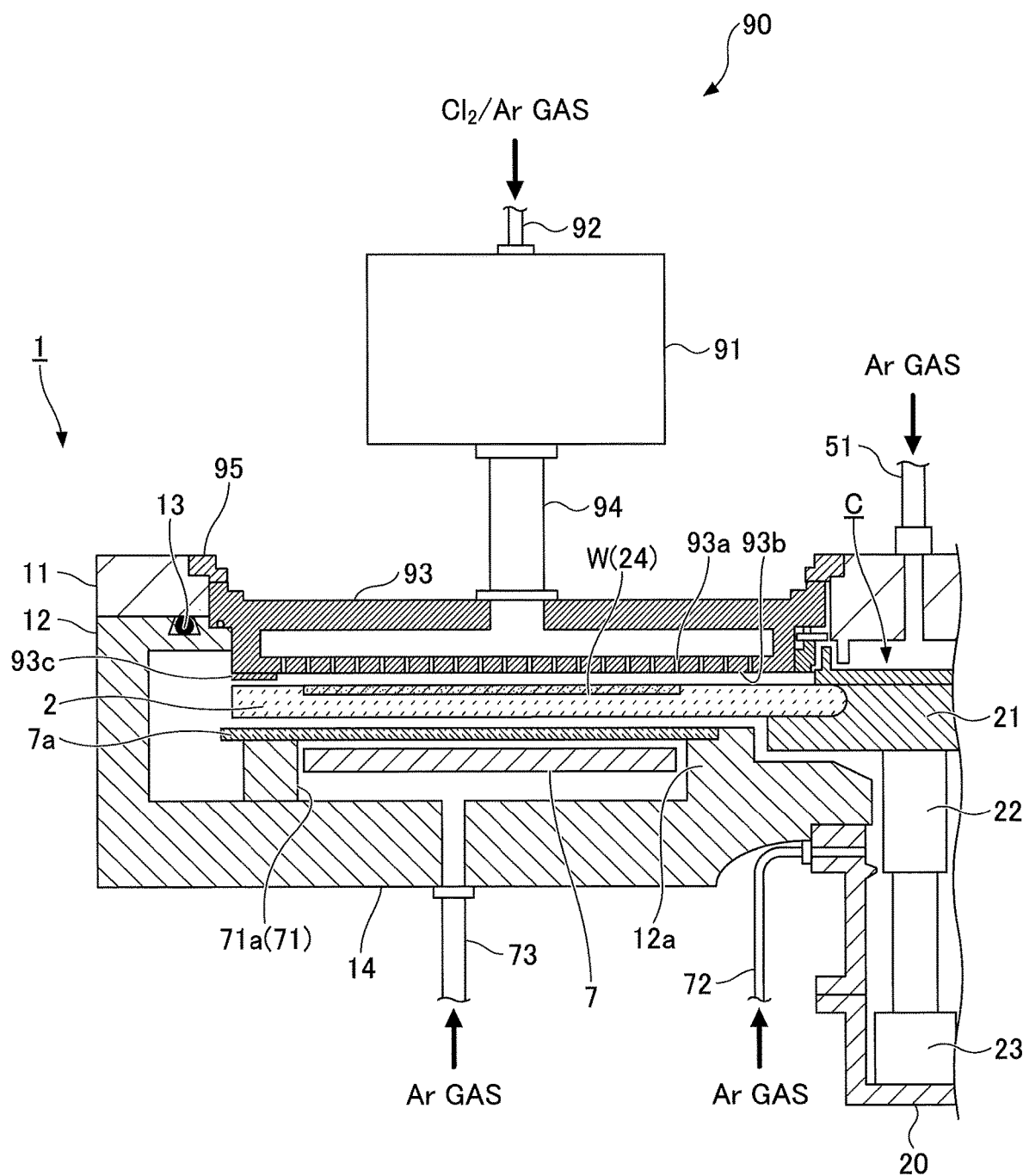
FIG. 10 is a partial cross-sectional view illustrating a third process region in a film deposition apparatus according to an embodiment of the present disclosure.

FIG. 10 is a cross-sectional view of a film deposition apparatus including a plasma generator 90 according to an embodiment.

As illustrated in FIG. 10, the plasma generator 90 is provided opposite to the turntable 2 in the third process region P3. The plasma generator 90 includes a plasma generation part 91, a gas supply pipe 92, a showerhead part 93, and a pipe 94. Here, the showerhead part 93 is an example of a chlorine gas discharge part, and for example, a gas nozzle may be used instead of the showerhead part 93.

The plasma generation part 91 activates chlorine gas supplied from the gas supply pipe 92 using a plasma source. The plasma source is not particularly limited as long as it is capable of activating chlorine gas to generate chlorine radicals. For example, an inductively coupled plasma (ICP), a capacitively coupled plasma (CCP), or a surface wave plasma (SWP) may be used as the plasma source.

The gas supply pipe 92 has one end that is connected to the plasma generation part 91 to supply chlorine gas to the plasma generation part 91. The other end of the gas supply pipe 92 is connected to the chlorine gas supply source 132 that stores chlorine gas via an on-off valve and a flow controller 122, for example.

The showerhead part 93 is connected to the plasma generation part 91 via the pipe 94. The showerhead part 93 supplies chlorine gas that has been activated by the plasma generation part 91 into the vacuum chamber 1. The showerhead part 93 has a fan-like shape in a planar view and is pressed downward along the circumferential direction by a press member 95 that is formed along the outer edge of the fan-like shape. The press member 95 is fixed to the ceiling plate 11 by a bolt or the like (not illustrated), and in this way, the internal atmosphere of the vacuum chamber 1 may be maintained airtight. The distance between a bottom surface of the showerhead part 93 when it is secured to the ceiling plate 11 and a surface of the turntable 2 may be arranged to be about 0.5 mm to about 5 mm, for example.

A plurality of gas discharge holes 93a are arranged at the showerhead part 93. In view of the difference in speed on a rotational center side and an outer peripheral side of the turntable 2, fewer gas discharge holes 93a are arranged on the rotational center side of the showerhead part 93, and more gas discharge holes 93a are arranged on the outer peripheral side of the showerhead part 93. The total number of the gas discharge holes 93a may be several tens to several hundreds, for example. Also, the diameter of the plurality of gas discharge holes 93a may be about 0.5 mm to about 3 mm, for example. Activated chlorine gas supplied to the showerhead part 93 is supplied to the space between the turntable 2 and the showerhead part 93 via the gas discharge holes 93a.

Figure 11:
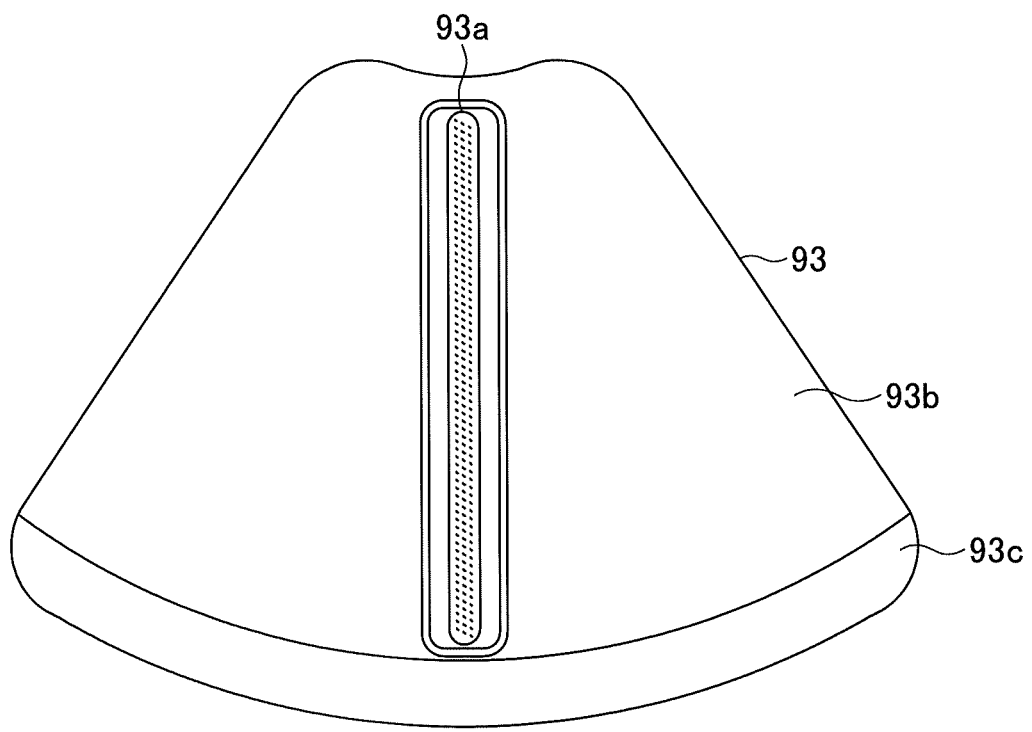
FIG. 11 is a planar view illustrating an example of a lower surface of a showerhead part according to an embodiment of the present disclosure.

FIG. 11 is a planar view illustrating an example of a lower surface of the showerhead part 93. As illustrated in FIG. 11, a downward protruding surface 93c may be provided in a belt-like form along the outer circumference of the lower surface 93b of the fan-shaped showerhead part 93. This can uniformly prevent the pressure on the outer peripheral side of the third process region P3 from decreasing in the circumferential direction. Moreover, the gas discharge holes 93a may be provided at the center of the lower surface 93b of the showerhead part 93 in the circumferential direction so as to extend in the radial direction. Thus, chlorine gas can be supplied in a dispersed manner from the central side throughout the outer peripheral side of the turntable 2.

Thus, activated chlorine gas may be supplied to the wafer W by using the remote plasma generator 90.

Here, the remote plasma generator is not limited to the structure including the showerhead part as illustrated in FIGS. 9 through 11, the remote plasma generator may have the structure using the reaction gas nozzle 33 illustrated in FIGS. 2 and 3. In this case, for example, the plasma generator 91 may be provided on an outer lateral surface of the chamber body 12, and may be configured to supply the chlorine radicals to the reaction nozzle 33 from the outer lateral surface.

As illustrated in FIG. 1, the film deposition apparatus according to the present embodiment further includes a controller 100 that is constituted of a computer and controls the entirety of the film deposition apparatus. A memory in the controller 100 stores a program by which the film deposition apparatus executes the film deposition method (as will be described below) under a control of the control unit 100. The program is formed to include steps capable of executing the film deposition method, and is stored in a medium 102 such as a hard disk, a compact disc, a magneto-optic disk, a memory card, and a flexible disk. A predetermined reading device reads the program into a storage part 101, and the program is installed in the controller 100.

Furthermore, the controller 100 also performs control for performing the method for depositing the silicon nitride film according to the embodiment of the present disclosure, which will be described later.

[Method for Depositing a Silicon Nitride FILM]

Next, a method for depositing a silicon nitride film according to an embodiment of the present invention is described below by citing an example of using the above-mentioned film deposition apparatus. The method for depositing the silicon nitride film includes two different types of deposition process constituted of a bottom-up film deposition process to deposit a silicon nitride film having a V-shaped cross section into a recessed pattern formed in a surface of a substrate, and a conformal film deposition process to deposit a conformal silicon nitride film along a surface shape of the recessed pattern or the deposited silicon nitride film. Each of the bottom-up film deposition process and the conformal film deposition process is described below.

FIGS. 12A through 12E are diagrams illustrating an example of a series of processes of the bottom-up film deposition process in the film deposition method according to the embodiment of the present disclosure. FIG. 12A is a diagram illustrating an example of a plasma modification process of the method for depositing the silicon nitride film according to the present embodiment.

In this embodiment, a silicon wafer is used as the wafer W, and the silicon wafer has a recessed pattern such as a trench and a via hole. In the following embodiment, as illustrated in FIG. 12A, an example of having a trench T formed in a surface of a wafer W is described. Although the trench T is not required to be formed in a surface of the wafer W as long as a certain trench pattern only has to be formed in the surface of the wafer W to perform filling deposition into the trench and the via hole, an example of forming the trench T in the surface of the wafer W is described for convenience of explanation. However, the method for depositing the silicon nitride film according to the embodiment can be applied to the wafer W in which a variety of patterns is formed including a flat surface.

Moreover, an example of supplying dichlorosilane (DCS, $SiH_2Cl_2$) and nitrogen gas as a carrier gas from the reaction gas nozzle 31, supplying a mixed gas of ammonia ($NH_3$) and argon as a nitriding gas from the reaction gas nozzle 32, and supplying a mixed gas of chlorine and argon as a chlorine-containing gas from the showerhead part 93, is described below. Here, because nitrogen gas that is a carrier gas of dichlorosilane, and argon gas supplied with the nitriding gas and chlorine gas are both inert gases and do not contribute to the reaction, the inert gases will not be particularly referred to hereinafter. Moreover, the nitriding gas is supplied while being activated (converted to plasma) by the ICP plasma generated by the plasma generator 80, and the chlorine-containing gas is supplied while being radicalized by the remote plasma generated by the plasma generator 90. An example of using nitrogen gas as the separation gas (purge gas) is described below.

First, in the film deposition apparatus described with reference to FIGS. 1 through 11, a gate valve (not illustrated in the drawings) is opened, and the transfer arm 10 (FIG. 3) transfers the wafer W from the outside to the concave portion 24 of the turntable 2 via the transfer port 15 (FIG. 2 and FIG. 3). This transfer is performed by raising and lowering the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are loaded into the respective concave portions 24.

Then, the gate valve is closed, and the vacuum pump 640 evacuates the vacuum chamber 1 to the attainable degree of vacuum. Then, the separation gas nozzles 41 and 42 discharge Ar gas as a separation gas at a predetermined flow rate. At this time, the separation gas supplying pipe 51 and the purge gas supplying pipes 72 and 73 also discharge Ar gas at a predetermined flow rate, respectively. With this, the pressure regulator 650 (FIG. 1) controls the vacuum chamber 1 to a preset processing pressure. Then, the heater unit 7 heats the wafers W to 400° C., for example, while the turntable 2 is rotated in a clockwise direction at a rotational speed of 10 rpm, for example. The rotational speed of the turntable 2 can be set at a variety of rotational speeds depending on the intended purpose. Also, the plasma generators 80 and 90 are turned on.

Subsequently, the reaction gas nozzle 32 (FIG. 2 and FIG. 3) supplies an activated nitriding gas, and a plasma modification of the surface of the wafer W starts. The surface of the wafer W including the inner surface of the trench T is nitride and modified with plasma. The first plasma modification process performs by rotating the turntable predetermined number of times until sufficiently nitriding the surface of the wafer W, finishes when the surface of the wafer W is modified, and stops the supply of the nitriding gas for a while. The turntable 2 continues to rotate while supporting the wafer W.

Here, the plasma modification process of FIG. 12A is not required, and may be performed as necessary. When the plasma modification process of FIG. 12A is not performed, FIG. 12B only has to be performed without performing the process illustrated in FIG. 12A after supplying the separation gas while rotating the turntable 2. Moreover, after performing the plasma modification process in FIG. 12A for a predetermined period of time, the process in FIG. 12B is subsequently performed. Before entering the process in FIG. 12B, the showerhead part 93 starts supplying chlorine radicals activated by the plasma generator 90, and the reaction gas nozzle 31 starts supplying dichlorosilane in addition to the supply of the nitriding gas from the reaction gas nozzle 32.

FIG. 12B is a diagram illustrating an example of a chlorine radical adsorption process in the bottom-up film deposition process. When the turntable 2 is rotated while supplying dichlorosilane from the reaction gas nozzle 31, an ammonia-containing gas from the second reaction gas nozzle 32, chlorine radicals from the showerhead part 93, and nitrogen gas from the separation gas nozzles 41 and 42, the wafer W pass a location under the third process region P3, thereby supplying chlorine radicals to the surface of the wafer W from the showerhead part 93. On this occasion, many chlorine radicals readily reach and adsorb on the top surface of the wafer W and an upper portion of the trench T, but because a lower portion of the trench T is deep, chlorine radicals hardly reach a deep portion around the trench T and hardly adsorb on a portion around the bottom surface of the trench T. In other words, an amount of the adsorbed chlorine radicals decreases toward the bottom surface and its neighborhood of the trench T from the upper end of the trench T. FIG. 12B illustrates a state of decrease in chlorine radicals toward the bottom surface of the trench T, to put it the other way around, a state of increase in chlorine radicals toward the top end from the bottom.

Here, chlorine reacts with H groups and generates HCl while forming Cl radical terminals by being replaced with H groups. Such Cl radicals form adsorption blocking groups for a chlorine-containing gas. As discussed above, chlorine radicals readily reach the upper portion of the trench, but scarcely reach the deep portion of the trench T, that is, the lower portion around the bottom portion. Because an aspect ratio of the trench T is high, many chlorine radicals are replaced by H groups before reaching the deep portion of the trench T. Hence, while Cl groups that are adsorption blocking groups densely form on the top surface of the wafer W and the upper portion of the trench T, many H groups of an $NH_2$ structure remain in the lower portion of the trench T and the density of Cl groups decreases.

FIG. 12C is a diagram illustrating an example of a source gas adsorption process in the bottom-up film deposition process. As illustrated in FIG. 12C, after the wafer W passes the separation region D and is purged by a supplied purge gas, the wafer W passes the first process region P1, where dichlorosilane is supplied to the wafer W. Dichlorosilane hardly adsorbs on the region where Cl groups that is the adsorption blocking groups are present, and adsorbs on a region where the adsorption blocking groups are absent. Hence, many dichlorosilane molecules adsorb on the bottom surface and its neighborhood, and hardly adsorb on the top surface of the wafer W and the upper portion of the trench T. In other words, dichlorosilane that is the source gas densely adsorb on the bottom portion and its vicinity, and less densely adsorb on the upper portion and the top surface of the wafer W.

FIG. 12D is a diagram illustrating an example of a silicon nitride film deposition process in the bottom-up film deposition process. As illustrated in FIG. 12D, after the wafer W passes the separation region D and is purged by a supplied purge gas, the wafer W passes the second process region P2, where an ammonia-containing gas activated by plasma is supplied to the wafer W. By supplying the ammonia-containing gas to the wafer W, dichlorosilane adsorbed in the trench T and supplied ammonia reacts with each other, thereby forming a molecular layer of a silicon nitride film as a reaction product. Here, because many dichlorosilane molecules adsorb on the bottom portion and its vicinity, a silicon nitride film is deposited much around the bottom surface of the trench T. Hence, the filling deposition with high bottom-up characteristics as illustrated in FIG. 12D can be achieved.

Next, when the wafer W passes the third process region P3, the state returns to FIG. 12B, and Cl groups that are adsorption blocking groups adsorb on the upper portion of the trench T and the top surface of the wafer W.

Hereinafter, by rotating the turntable 2 repeatedly while supplying each reaction gas, a cycle illustrated from FIG. 12B to FIG. 12D are repeated, a silicon nitride film (SiN film) 110 is deposited from the bottom surface side without closing an opening of the trench T. Then, as illustrated in FIG. 12D, the silicon nitride film 110 with high bottom-up properties that does not close the opening can be deposited while forming a V-shaped cross section.

FIG. 12E is a diagram illustrating a silicon nitride film 110 having a V-shaped cross section formed in the trench T. The silicon nitride film 110 is thickly deposited on the bottom surface of the trench T, and the silicon nitride film is more thinly deposited on the upper portion of the trench T than on the bottom portion. Thus, by performing the bottom-up film deposition process in the method for depositing the silicon nitride film according to the embodiment, the silicon nitride film having the V-shaped cross section can be deposited in the trench T.

Figure 12:
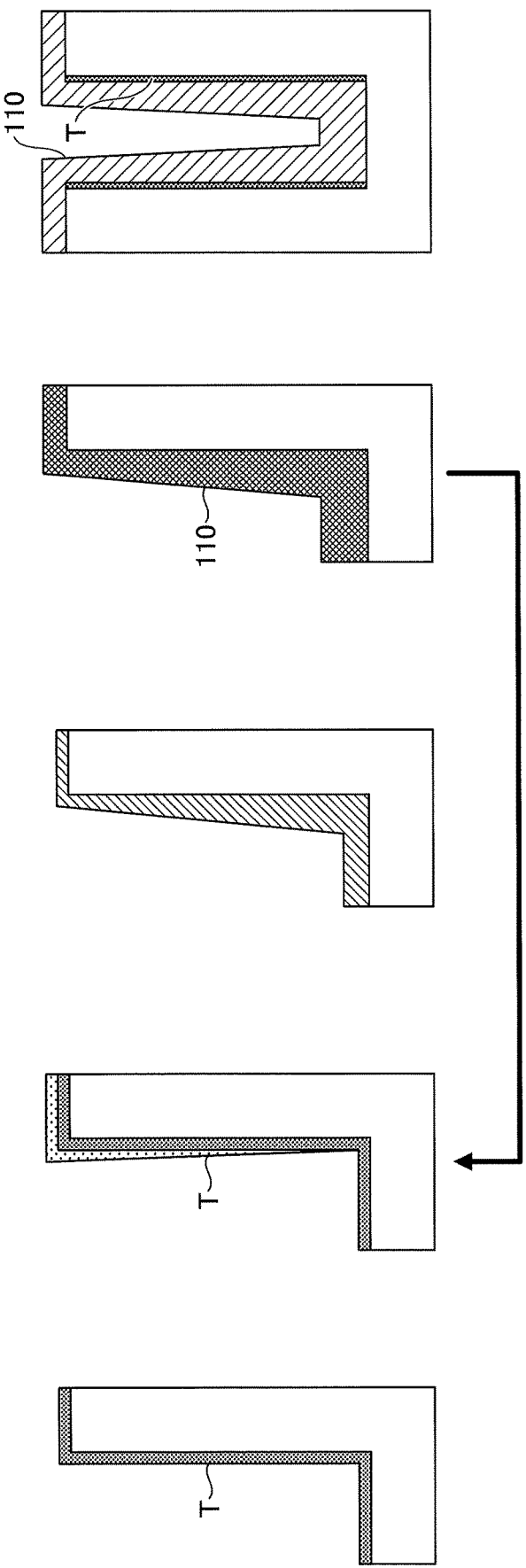
FIGS. 12A through 12E illustrate a series of processes of an example of a method for depositing a silicon nitride film according to an embodiment of the present disclosure.
Figure 13:
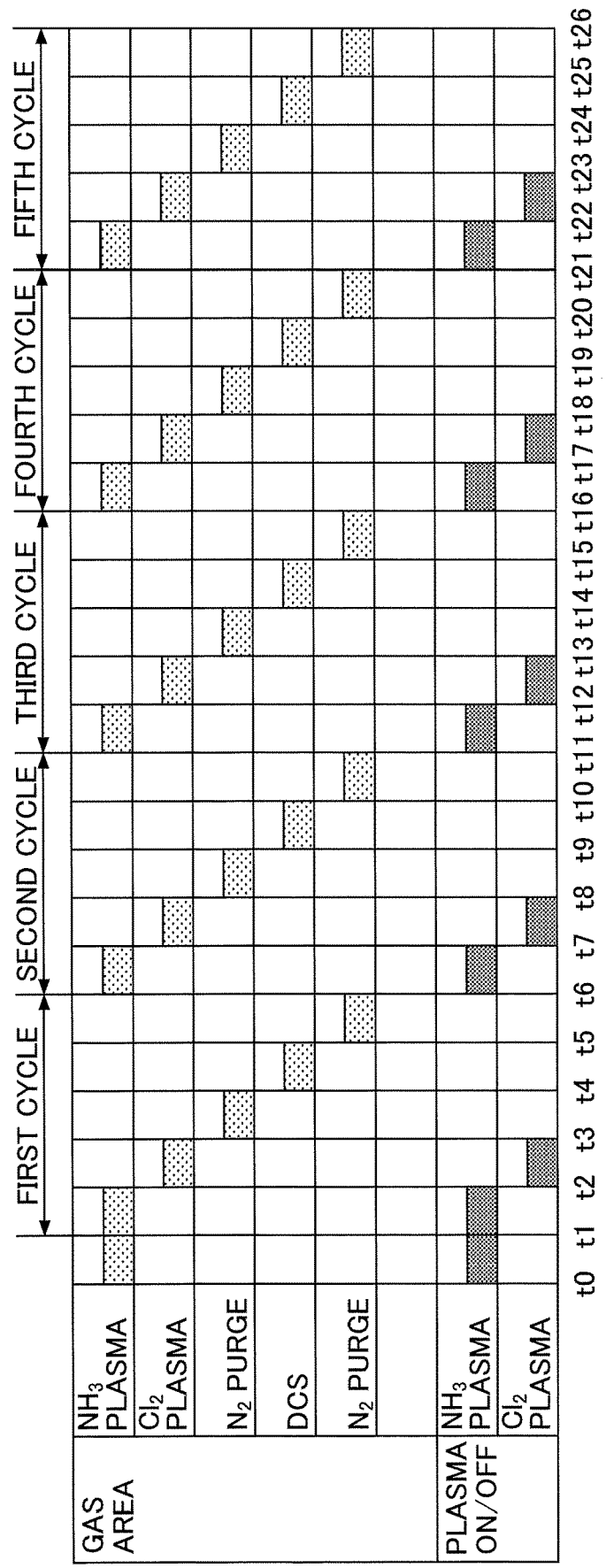
FIG. 13 is a diagram illustrating an example of a sequence of a method for depositing a silicon nitride film according to an embodiment of the present disclosure.
Figure 14:
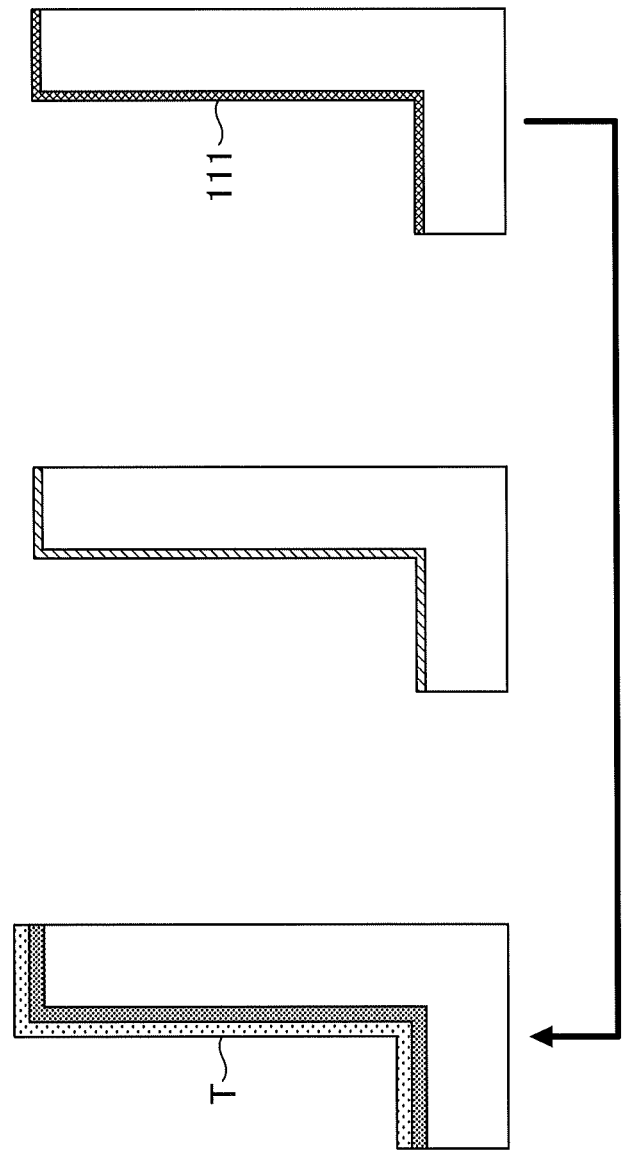
FIGS. 14A through 14D are diagrams illustrating a series of processes of an example of a conformal deposition process of a method for depositing a silicon nitride film according to an embodiment of the present disclosure.

FIG. 13 is a diagram illustrating an example of a sequence of the bottom-up film deposition process illustrated in FIG. 12A through 12E. In FIG. 13, a horizontal axis shows a time axis, and a vertical axis shows types of gases and on/off of plasma. FIG. 13 illustrates a sequence from 0 to 5 cycles.

A period of time t0 to t1 illustrates a sequence of the plasma modification process illustrated in FIG. 12A. In the plasma modification process, the reaction gas nozzle 32 supplies an ammonia ($NH_3$) containing gas, and the plasma generator 80 is turned on. Hence, during the period of time t0 to t1, $NH_3$ plasma is supplied.

A period of time t1 to t6 illustrates a sequence of a first revolution of the turntable 2. As discussed above, by the rotation of the turntable 2, the wafer W placed on the concave portion of the turntable 2 passes the second process region P2, the third process region P3, the separation region D, the first process region P1, and the separation region D in this order.

FIG. 13 illustrates a sequence of timing when each gas is actually supplied to a surface of a wafer W. More specifically, in the above-mentioned film deposition apparatus, the reaction gas nozzles 31 and 32, the showerhead part 93, and the separation gas nozzle 41 and 42 continuously supply the gases; the wafer W moves by the rotation of the turntable 2; and the gases are supplied to the wafer W at timing when the wafer W passes the first to third process regions P1 through P3 and the separation regions D, respectively, but the sequence in FIG. 13 does not illustrate timing when the film deposition apparatus supplies gas, but illustrates timing when the gases are supplied to the surface of the wafer W. Thus, the sequence in FIG. 13 can be applied to not only the turntable type film deposition apparatus but also a film deposition apparatus in which gases are supplied into a process chamber containing a wafer W therein while changing types of the gases sequentially.

During a period from time t1 to t2, a nitriding process is performed. When the wafer W passes the second process region P2, ammonia gas suppled from the second reaction gas nozzle 32 is activated by the plasma generator 80 and is supplied to the surface of the wafer W. This is substantially the same as the plasma modification process t0 to t1. By such a nitriding process, $NH_2$ groups adsorb on the entire surface of the wafer W including the inner surface of the trench T, and an adsorption site is formed on the entire surface of the wafer W.

During a period from time t2 to t3, a chlorine radical adsorption process is performed. When the wafer W passes the third process region P3 by the rotation of the turntable 2, the showerhead part 93 of the plasma generator 90 supplies chlorine radicals to the surface of the wafer W. As described with reference to FIG. 12B, many chlorine radicals adsorb on the top surface of the wafer W and the upper portion of the trench T, but hardly adsorb on the lower portion including the bottom surface of the trench T. Hence, different amounts of chlorine radicals adsorb on the inner surface of the trench T depending on the depth in the trench T. The region where chlorine radicals have adsorbed becomes an adsorption blocking region against dichlorosilane containing chlorine, and the region where chlorine radicals do not adsorb remains as the adsorption site formed in the nitriding process. Here, the adsorption blocking region may be referred to as a non-adsorption site.

During a period from time t3 to t4, a purge process is performed. When the wafer W passes the separation region D by the rotation of the turntable 2, nitrogen gas is supplied to the surface of the wafer W, and the surface of the wafer W is purged and cleaned.

During a period from time t4 to t5, a source gas adsorption process is performed. When the wafer W passes the first process region 21 by the rotation of the turntable 2, the reaction gas nozzle 31 supplies dichlorosilane to the surface of the wafer W, and dichlorosilane adsorbs on the surface of the wafer W. On this occasion, as described with reference to FIG. 12C, dichlorosilane adsorb on the adsorption site having $NH_2$ groups much, but do not adsorb on the adsorption blocking region having adsorbed chlorine very much. Hence, dichlorosilane adsorbs on the lower portion of the trench T where the adsorption site is exposed much, but do not adsorb on the upper portion of the trench T and the top surface of the wafer W very much.

During a period from time t5 to t6, a purge process is performed. As described in the period from time t3 to t4, when the wafer W passes the separation region D by the rotation of the turntable 2, nitrogen gas is supplied to the surface of the wafer W, and the surface of the wafer W is purged and cleaned.

During a period from time t6 to t7, a nitriding process (or nitriding film deposition process) is performed. When the wafer passes the second process region P2 by the rotation of the turntable 2, ammonia gas suppled from the reaction gas nozzle 32 is activated by the plasma generator 80, then supplied to the surface of the wafer W, and reacts with dichlorosilane adsorbed on the surface of the wafer W, thereby depositing a molecular layer of a silicon nitride film that is a reaction product on the surface of the wafer W. As described above, because dichlorosilane adsorbs on the lower portion including the bottom surface of the trench T, the silicon nitride film is thickly deposited on the lower portion of the trench T. In contrast, the silicon nitride film is thinly deposited on the upper portion of the trench T and the top surface of the wafer W where dichlorosilane has hardly adsorbed. Thus, the silicon nitride film having the V-shaped cross section described with reference to FIG. 12E is deposited in the trench T.

In and after the second cycle, cycles similar to the first cycle are repeated. As illustrated in FIG. 12D, the silicon nitride film having the V-shaped cross section is gradually deposited, and the trench T is gradually filled with the silicon nitride film from the bottom surface side.

Here, because the silicon nitride film having the V-shaped cross section is thick at its bottom part and thin at its upper part, an effect of plasma modification differs depending on its location. In other words, the thin silicon nitride film formed on the upper portion of the trench T and the top surface of the wafer W is sufficiently modified by plasma, and is formed as a high-density and high-quality film. However, the silicon nitride film thickly deposited on the bottom portion of the trench T is liable to be less densely formed with low quality, without being modified with plasma. Such a phenomenon seems to occur because the film thickness is great while a period of plasma irradiation is constant, thereby running short of the plasma modification. When the plasma modification is insufficiently performed, a void or a seam is liable to be generated because a film partially collapses in a subsequent process, which may affect the subsequent process and further later processes.

Therefore, in the method for depositing the silicon nitride film according to an embodiment of the present disclosure, after the bottom-up film deposition described with reference to FIGS. 12 and 13 is performed, a thin and conformal silicon nitride film is deposited and is modified with plasma well, thereby enhancing quality of the silicon nitride film and preventing the collapse in the subsequent process.

FIGS. 14A through 14D are diagrams illustrating a series of processes of an example of a conformal film deposition process in the method for depositing the silicon nitride film according to the embodiment of the present disclosure. In FIGS. 14A through 14D, an example of performing the conformal film deposition process in a state of not depositing a silicon nitride film on a wafer yet, is described because it makes easier to understand the conformal film deposition process.

FIG. 14A is a diagram illustrating an example of a chlorine radical adsorption process in the conformal film deposition process, The chlorine radical adsorption process in the conformal film deposition process is performed while stopping the supply of the activated nitriding gas. In this regard, this chlorine adsorption process differs from the chlorine adsorption process in the bottom-up film deposition process.

In the chlorine radical adsorption process in the conformal film deposition process, the turntable 2 is rotated predetermined number of times while the showerhead part 93 supplies chlorine radicals, thereby adsorbing chlorine radicals on the surface of the wafer W including the inner surface of the trench T. In the chlorine radical adsorption process, although the separation gas nozzles 41 and 42 supply nitrogen gas that is the separation gas, a state of not supplying dichlorosilane that is the source gas from the reaction gas nozzle 31, and not supplying ammonia gas that is the nitriding gas from the reaction gas nozzle 32, is maintained.

As described above, the chlorine radicals control the adsorption of dichlorosilane because the chlorine radicals have an adsorption blocking effect with respect to dichlorosilane that contains chlorine. In the chlorine radical adsorption process, the chlorine radicals having such an adsorption blocking effect are caused to adsorb until thinly reaching the entire surface including the bottom and its surroundings of the trench T, and forms the adsorption blocking region such that dichlorosilane conformally adsorbs on the surface of the wafer along the shape of the surface of the wafer W. In other words, the chlorine radicals do not necessarily have to conformally adsorb on the surface of the wafer W, the adsorption blocking region is formed so that uneven adsorption of dichlorosilane is prevented and that conformal dichlorosilane adsorbs on the entire surface of the wafer W when the next dichlorosilane is suppled.

Such an adjustment to an area of the adsorption blocking region is performed by adjusting a supply period of the chlorine radicals. With respect to the film deposition apparatus according to the embodiment, a period of the chlorine radical adsorption process can be readily adjusted by adjusting how many times the turntable 2 is rotated while continuing the radical adsorption process. In other words, by setting a number of revolutions of the turntable 2 while continuing the chlorine radical adsorption process at a high value, the chlorine radicals adsorb to the neighborhood of the bottom surface and the adsorption blocking region is formed widely, whereas the adsorption range narrows by decreasing the number of revolutions of the turntable 2. When the adsorption blocking region is formed in a wide range, dichlorosilane is likely to conformally adsorb, but because the adsorption is blocked, the film deposition rate negatively decreases. Hence, the period of time of the chlorine adsorption process is preferably adjusted to an appropriate period. When the rotational speed of the turntable 2 is 10 rpm, for example, by continuing the chlorine radical adsorption process during 3 to 5 revolutions of the turntable 2, dichlorosilane conformally adsorbs on the surface of the wafer W.

FIG. 14B is a diagram illustrating an example of a source gas adsorption process. In the source gas adsorption process, the source gas containing silicon and chlorine is supplied to the surface of the wafer W. In other words, the reaction gas nozzle 31 supplies dichlorosilane. Thus, dichlorosilane that is the source gas adsorbs on the surface of the wafer W. On this occasion, because the adsorption blocking region is formed in a relatively wide range, dichlorosilane that is the source gas thinly and conformally adsorbs on the surface of the wafer W along the surface shape of the wafer W. In other words, dichlorosilane thinly adsorbs along the inner surface of the trench T.

FIG. 14C is a diagram illustrating an example of a nitriding process. In the nitriding process, ammonia that is the nitriding gas is supplied to the surface of the wafer on which dichlorosilane has adsorbed. In other words, the reaction gas nozzle 32 supplies the nitriding gas, and the nitriding gas activated by the plasma generator 80 is supplied to the surface of the wafer W. Activated ammonia reacts with dichlorosilane, and a molecular layer of silicon nitride that is a reaction product is deposited on the surface of the wafer W. Because dichlorosilane conformally adsorbs on the surface of the wafer W along the surface shape of the wafer W, the molecular layer of the silicon nitride film is conformally deposited.

Here, the supply of the source gas from the reaction gas nozzle 31 and the supply of the nitriding gas from the reaction gas nozzle 32 may start at the same time. As illustrated in FIGS. 2, 3 and 9, because the wafer W reaches the source gas supply region P1 after passing through the chlorine supply region P3, and then reaches the nitriding gas supply region P2 when the turntable 2 is rotated in a clockwise fashion, the nitriding process is performed after the source gas adsorption process even if the supply of the source gas and the nitriding gas starts at the same time. In other words, here, the same operation as that of the bottom-up film deposited is performed.

Because the nitriding gas activated by plasma is supplied in the nitriding process, the modification of the silicon nitride film is performed at the same time. Here, because a molecular layer of the deposited silicon nitride film is thin, the plasma reaches a deep portion of the trench T, thereby performing the plasma modification uniformly. Hence, a high-quality silicon nitride film that is sufficiently modified can be deposited.

Here, during the source gas adsorption process and the nitriding process illustrated in FIGS. 14B and 14C, respectively, the supply of chlorine radicals may be stopped or may not be stopped. In terms of moving to the next chlorine radical adsorption process smoothly, the supply of chlorine radicals is not preferably stopped. The chlorine radical adsorption process illustrated in FIG. 14A is continuously performed for a predetermined period of time while rotating the turntable 2 multiple times, whereas the source gas adsorption process and the nitriding process in FIGS. 14B and 14C are performed while rotating the turntable 2 only one time. In other words, in the arrangement illustrated in FIGS. 2, 3 and 9, the wafer W on the turntable 2 receives the supply of source gas at the first process region P1 after receiving the supply of chlorine radicals at the third process region P3, and receives the supply of chlorine radicals by entering the third process region P3 immediately after the source gas adsorbed on the surface of the wafer W is nitrided so that a molecular layer of a SiN film is deposited on the surface of the wafer W at the second process region P2. Thus, the sequence from FIG. 14A to 14C can be continuously performed without stopping the supply of chlorine radicals.

Here, in the source gas adsorption process and the nitriding process of FIGS. 14B and 14C, by nitriding the source gas, the molecules terminate with hydrogen radicals of an $NH_2$ structure, and an adsorption site is formed for the source gas. Subsequently, when chlorine radicals are supplied in the chlorine radical adsorption process in FIG. 14A, H groups of the $NH_2$ structure is converted to Cl groups. As discussed above, because the source gas contains chlorine and because chlorine atoms do not adsorb to each other, the source gas does not adsorb on a location that is terminated with chlorine. Thus, the locations terminated with Cl groups serve as adsorption blocking groups, and block the adsorption of the source gas. Here, many chlorine radicals adsorb on the surface of the wafer W and an upper portion of the trench T in the first revolution because chlorine radicals readily reach the surface of the wafer W and the upper portion of the trench T, but the turntable 2 has to be rotated more to cause chlorine radicals to reach the deep portion of the trench T because chlorine radicals are unlikely reach a lower portion and the bottom portion of the recessed pattern. To achieve this, in the method for depositing the silicon nitride film in the embodiment, a period of time when only chlorine radicals and the separation gas are supplied is extended longer than a period of time when the source gas and the activated nitriding gas are suppled, thereby depositing a thin and conformal silicon nitride film layer to the shape of the trench T. By depositing such a thin and conformal silicon nitride film, the nitriding gas activated by plasma reaches the deep portion near the bottom surface of the trench T in the nitriding process of FIG. 14C, and an effect of the plasma modification can be enhanced due to the thin film thickness, thereby depositing a high-quality silicon nitride film.

Thus, consecutively repeating the processes from FIG. 14A to FIG. 14C, a conformal silicon nitride film to the surface shape of the trench T is gradually deposited in the trench T. Although a deposition rate is not as high as ordinary film deposition due to an influence of chlorine radicals that are the adsorption blocking groups, the high-quality silicon nitride film on which the plasma modification is sufficiently performed can be deposited without closing the opening of the trench T.

When such a high-quality and conformal silicon nitride film 111 that is sufficiently modified with plasma is formed on the silicon nitride film 110 formed by the bottom-up film deposition having the V-shaped cross section described with reference to FIGS. 12 and 13, total quality of the silicon nitride film 110 and 111 filled into the trench T can be improved. In other words, by inserting layers of the high-density and high-quality conformal film 111 into the less dense bottom-up film 110, a state of filling hard reinforced layers into a silicon nitride film is formed, thereby preventing the partial collapse of the silicon nitride film 110 and 111.

Hence, by performing the bottom-up film deposition described with reference to FIGS. 12 and 13 and the conformal film deposition alternately, a high-quality film can be formed while maintaining productivity. That is, by repeating a two-step film deposition constituted of the bottom-up film deposition having high productivity while having a slight concern about the film quality of the bottom portion, and the conformal film deposition to cover a film formed by the bottom-up film deposition with a conformal film wholly having high quality while having less productivity, the trench T can be filled with the silicon nitride films 110 and 111 structured by alternately stacking the bottom up film 110 and the conformal film 111 in layers.

Here, a proportion of performing the bottom-up film deposition and the conformal film deposition can be properly determined depending on the intended purpose. The proportion of the bottom-up film is increased when the productivity is prioritized, whereas the proportion of the conformal film deposition is increased when the film quality is prioritized.

FIG. 14D is a diagram illustrating an example of the plasma modification process. In the plasma modification process of FIG. 14D, the reaction gas nozzle 32 supplies the nitriding gas activated by the plasma generator 80 to the SiN film, thereby modifying the SiN film with the plasma. This process performs the same operation as that of the plasma modification process performed in FIG. 12A, but differs from the plasma modification process in FIG. 12A in that modification of the deposited silicon nitride film is intended. In a final stage of the trench filling, when filling the trench T with the silicon nitride film ends, such a plasma modification process may be performed. Otherwise, even not in the final stage, when the conformal film deposition process ends and before the process moves to the bottom-up film deposition process, the plasma modification process may be performed.

When the nitridation of the silicon nitride film is insufficient, the silicon nitride film is sufficiently nitrided by supplying the nitriding gas activated by plasma, and a high-density, fine and high-quality silicon nitride film can be deposited. As described above, the plasma modification process is performed by supplying only the nitriding gas activated by plasma and the separation gas without supplying the source gas and the chlorine radicals. The surface of the wafer including the inner surface of the trench T is nitrided and modified by the plasma modification process. Here, the plasma modification process only has to be performed as necessary and is not required similar to the plasma modification process in FIG. 12A. However, the plasma modification process is preferably performed to obtain a further high-quality silicon nitride film.

After the trench filling film deposition ends by alternately repeating the bottom-up film deposition and the conformal film deposition process, the supply of all gases and the plasma generators 80 and 90 are stopped while the rotation of the turntable 2 is stopped. Then, the turntable 2 is intermittently rotated and stopped, and the wafers W are lifted by lift pins, and are sequentially carried out of the vacuum chamber in an opposite procedure to the carry-in of the wafers W. The high-quality silicon nitride film 110 and 111 having less voids and seams and whose strength is enhanced by the conformal film deposition is deposited in the trench T formed in the surface of the wafer W.

Thus, according to the method for depositing the silicon nitride film of the embodiment, a recessed pattern can be very efficiently filled with a high-quality silicon nitride film by combining bottom-up film deposition that can fill a trench T without generating a void and a seam with high productivity and conformal film deposition that can deposit a conformal and high-quality silicon nitride film along a surface shape of a wafer or an already deposited film.

Figure 15:
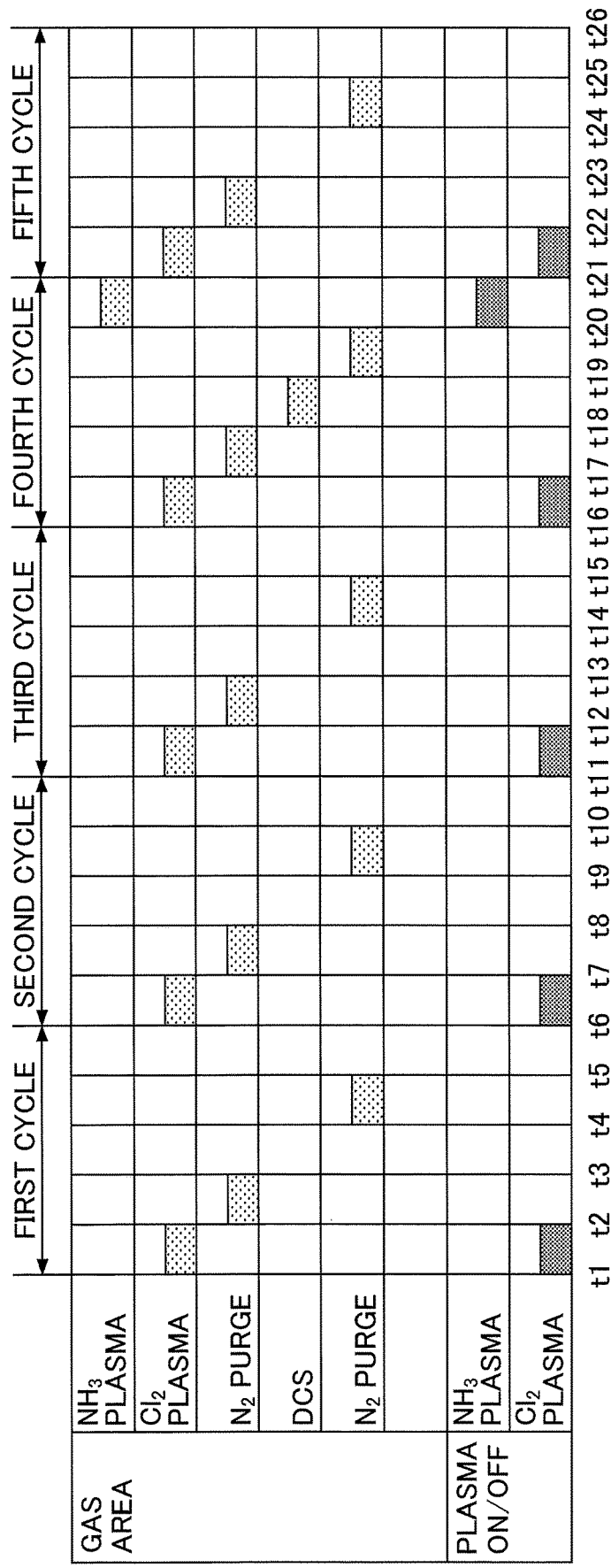
FIG. 15 is an example of a sequence of a conformal film deposition process of a method for depositing a silicon nitride film according to an embodiment of the present disclosure.

FIG. 15 is a diagram illustrating an example of a sequence of the conformal film deposition process of the method for depositing the silicon nitride film according to an embodiment of the present disclosure. In FIG. 15, a horizontal axis shows a time axis, and a vertical axis shows types of supplying gases and an on-off of plasma. FIG. 15 illustrates a sequence of 1 to 5 cycles.

A period of time t1 to t6 illustrates a sequence of a first revolution of the turntable 2. In the first revolution of the turntable 2, chlorine radical adsorption process is performed. In the chlorine radical adsorption process, the plasma generator 90 supplies chlorine radicals. Hence, in a first cycle, chlorine ($Cl_2$) plasma is on, and the chlorine radicals are supplied. In addition, nitrogen($N_2$) is supplied as a purge gas.

During a period from time 1 to t6, chlorine radicals adsorb on a surface of a wafer W including a patterned shape such as a trench T. The sequence in FIG. 15 is illustrated in a gas supplying order to the wafer W. In other words, in the period of time t1 to t6 of the first cycle, although the showerhead part 93 supplies chlorine radicals while the separation gas nozzles 41 and 42 supply nitrogen gas without stopping, the sequence in FIG. 15 illustrates a temporal sequence in which the gases are actually supplied to the surface of the wafer W. More specifically, chlorine radicals are supplied to the wafer W while the wafer W passes a location under the showerhead part 93 during the period of time t1 to t2, and nitrogen gas is supplied while the wafer passes a location under the separation regions D only during periods of time t2 to t3 and time t4 to t5. In other words, the sequence illustrated in FIG. 15 can be applied to not only the turntable type film deposition apparatus but also a film deposition apparatus in which gases are supplied into a process chamber containing a wafer W therein while changing types of the gases sequentially.

A period during time t6 to t11 corresponds to the second cycle, and a period during time t11 to t16 corresponds to the third cycle, any of which has the same sequence as that of the first cycle. Thus, by repeating the chlorine radical adsorption process multiple cycles, as described in FIG. 14A, chlorine radicals reach the deep location of the trench T, and the source gas can adsorb conformally.

A period during time t16 to t21 corresponds to the fourth cycle, and illustrates a sequence of consecutively performing the source gas adsorption process and the nitriding process one time after performing the chlorine radical adsorption process one time. During time t16 to t17, the chlorine radical adsorption process is performed subsequent to the third cycle, and the wafer W passes the first process region P1, where DCS (dichlorosilane) of the source gas during is suppled and adsorbs on the surface of the wafer W during time t18 to t19 after the wafer W passes the separation region D during time t17 to t18. At this time, DCS adsorbs on the surface of the wafer W conformally to the surface shape of the wafer W, thinly and uniformly as a whole. After passing the location under the separation region D during time t19 to t20, the wafer W passes the location under second process region P2 during time t20 to t21. In the second process region P2, the reaction gas nozzle 32 supplies an ammonia-containing gas, and ammonia plasma ionized or radicalized by the plasma generator 80 is supplied to the surface of the wafer W. Dichlorosilane and ammonia react with each other on the surface of the wafer W, and a molecular layer of a silicon nitride film 111 that is a reaction product is thinly deposited. Because dichlorosilane conformally adsorbs on the surface, the molecular layer of the silicon nitride film 111 is formed conformally to the surface shape of the silicon nitride film 110. Moreover, because the adsorption layer of dichlorosilane is thin, the ammonia plasma sufficiently exerts its modification effect, and the silicon nitride film becomes a high-density and fine film. Thus, a high-quality and conformal silicon nitride film 111 along the surface shape of the wafer W is formed in the trench T.

A period of time t21 to t26 corresponds to the fifth cycle, where the same sequence as that of the first cycle is repeated. Subsequently, by repeating the second to fourth cycles, the chlorine radical adsorption process, the source gas adsorption process, and the nitriding process are sequentially repeated, thereby depositing a conformal and high-quality silicon nitride film on the surface of the wafer W. Then, when the film reaches a predetermined film thickness, the sequence ends. Otherwise, as necessary, further quality improvement of the silicon nitride film may be intended, by performing the plasma modification process described with reference to FIG. 14D.

Thus, according to the conformal film deposition process of the method for depositing the silicon nitride film of the present embodiments, the high-quality and conformal silicon nitride film 111 to the surface shape of the already formed silicon nitride film 110 can be deposited by widely adsorbing chlorine radicals that become adsorption blocking groups for the source gas containing silicon and chlorine on adsorption radicals, causing the source gas to conformally adsorb while reducing an amount of adsorption per one time, and nitriding the source gas while sufficiently exerting the plasma modification effect.

Moreover, although FIG. 15 illustrates the sequence of performing the source gas adsorption process and the nitriding process one time after performing the chlorine radical adsorption process four times, a proportion of number of times or periods between the chlorine radical adsorption process, the source gas adsorption process and the nitriding process can be set variously depending on the intended purpose.

Thus, contents of the conformal film deposition process can be set variously. Furthermore, by combining the conformal film deposition process with the bottom-up film deposition process, the void and the like can be inhibited, and the high quality filling deposition with the silicon nitride film can be achieved.

In the method for depositing the silicon nitride film that performs the filling deposition in two stages according to the embodiments, a combination of the bottom-up film deposition process and the conformal film deposition process is considered variously. For example, a cycle of repeating the bottom-up film deposition 5 cycles and performing the conformal film deposition 5 cycles may be alternately repeated.

Although a starting order of the bottom-up film deposition and the conformal film deposition is variously considered, for example, a combination of starting the bottom-up film deposition at first, then alternately repeating the bottom-up film deposition and the conformal film deposition, and finally performing the conformal film deposition may be adopted. Moreover, the bottom-up film deposition may be performed after the conformal film deposition is sufficiently performed at first to form a under coat film.

Figure 16:
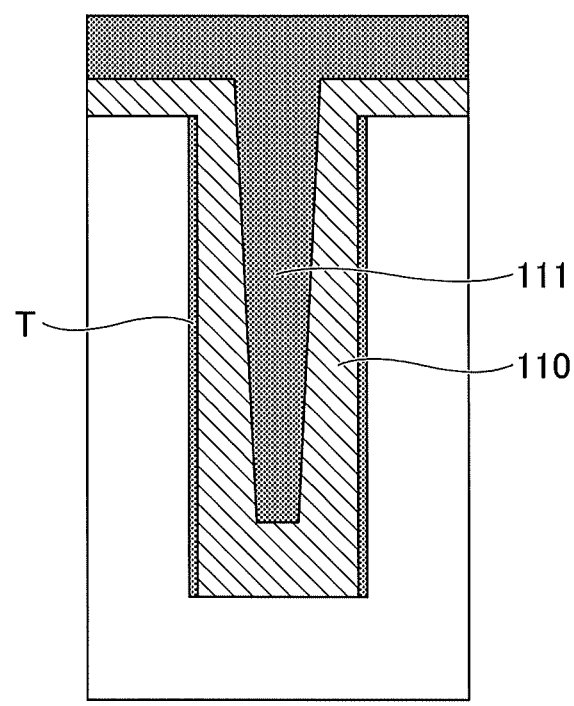
FIG. 16 is a diagram illustrating an example of filling film deposition combining bottom-up film deposition and conformal film deposition according to an embodiment of a method for depositing a silicon nitride film.

FIG. 16 is a diagram illustrating an example of a filling deposition combining the bottom-up film deposition and the conformal film deposition. As illustrated in FIG. 16, a V-shaped cross section may be filled with a conformal film 111 by filling a trench T with a silicon nitride film 110 by bottom-up film deposition at first, and finally filling the V-shaped cross section with a conformal silicon nitride film 111 by conformal film deposition.

Here, a number of repetitions of the bottom-up film deposition and the conformal film deposition can be determined variously depending on the intended purpose, and the number of repetitions can be set at a variety of number of times as long as both of the bottom-up film deposition and the conformal film deposition are performed at least one time.

Each of the number of repetitions may be preliminarily determined by a recipe, or may be determined by controlling timing of performing the bottom-up film deposition and the conformal film deposition depending on a film thickness using a provided film thickness measuring unit.

Furthermore, a variety of gases can be used as the source gas as long as the gas contains silicon and chlorine. For example, as described above, in addition to dichlorosilane, a variety of chlorosilane-based gases such as monochlorosilane ($SiH_3Cl$), trichlorosilane ($SiHCl_3$) and hexachlorosilane ($Si_2Cl_6$) may be used as the source gas. Also, a variety of nitriding gases can be used as the nitriding gas as long as the nitriding gas contain ammonia and nitrogen and can deposit a silicon nitride film as a reaction product by nitriding the source gas due to the activation of plasma. Similarly, a variety of chlorine-containing gases can be used as long as the chlorine-containing gas can form an adsorption blocking region on a surface of a wafer W by chlorine radicals.

The sequence described in FIGS. 12 and 13 can be executed by the controller 100 of the above-mentioned film deposition apparatus. The controller 100 controls periods of gas supply, timings, operation of the plasma generators 80 and 90, thereby performing the sequence. Because the film deposition apparatus according to the embodiment can rotate the turntable 2 and can change a gas supply pattern, the film deposition apparatus can control a gas supply period by controlling a number of revolutions while keeping the same gas supply conditions. Thus, because the film deposition apparatus according to the embodiment can readily implement the sequence in FIGS. 12 through 15 while readily controlling an adsorption amount of each gas, the method for depositing the silicon nitride film can be preferably performed.

As discussed above, according to the embodiments of the present disclosure, a recessed pattern can be filled with a high-quality silicon nitride film.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for depositing a silicon nitride film to fill a recessed pattern formed in a surface of a substrate with a silicon nitride film, comprising steps of:

depositing a first silicon nitride film in the recessed pattern formed in the surface of the substrate, the first silicon nitride film having a V-shaped cross section decreasing its film thickness upward from a bottom portion of the recessed pattern; and depositing a second silicon nitride film conformal to a surface shape of the first silicon nitride film, wherein the step of depositing the first silicon nitride film comprises starting filling the recessed pattern with the first silicon nitride film, and wherein the step of depositing the first silicon nitride film comprises steps of:

forming an adsorption blocking region on the surface of the substrate and a predetermined upper region of an inner surface of the recessed pattern by adsorbing chlorine radicals on the surface of the substrate and the predetermined upper region of the inner surface of the recessed pattern;

adsorbing a source gas that contains silicon and chlorine on an adsorption site formed in a predetermined lower region in the recessed pattern by supplying the source gas to the surface of the substrate including the inner surface of the recessed pattern, the predetermined lower region being a region other than the adsorption blocking region formed on the surface of the substrate and the predetermined upper region of the inner surface of the recessed pattern; and depositing the first silicon nitride film on the adsorption site by supplying a nitriding gas activated by plasma to the surface of the substrate including the inner surface of the recessed pattern and causing a reaction between the source gas adsorbed on the surface of the substrate and the nitriding gas.

2. The method according to claim 1, wherein the steps of depositing the first silicon nitride film and depositing the second nitride film are alternately repeated.

3. The method according to claim 1, wherein the step of depositing the second silicon nitride film comprises depositing the second silicon nitride film having a higher film density than a film density of the first silicon nitride film.

4. The method according to claim 1, wherein the step of depositing the second silicon nitride film comprises finally filling up the recessed pattern with the second silicon nitride film.

5. The method according to claim 1, further comprising:
supplying a first purge gas to the surface of the substrate between the steps of forming the adsorption blocking region and adsorbing the source gas; and
supplying a second purge gas to the surface of the substrate between the steps of adsorbing the source gas and depositing the silicon nitride film.

6. The method according to claim 5,
wherein the step of depositing the second silicon nitride film comprises:
forming a second adsorption blocking region such that a chlorine-containing gas conformally adsorbs on the surface of the substrate by adsorbing second chlorine radicals on the surface of the substrate;
adsorbing a second source gas that contains silicon and chlorine on the second adsorption blocking region adsorbed on the surface of the substrate; and
depositing the second silicon nitride film on the surface of the substrate by supplying a second nitriding gas activated by plasma to the second source gas adsorbed on the surface of the substrate.

7. The method according to claim 6, further comprising:
supplying a third purge gas to the surface of the substrate between the steps of forming the second adsorption blocking region and adsorbing the second source gas; and
supplying a fourth purge gas to the surface of the substrate between the steps of adsorbing the second source gas and depositing the second silicon nitride film.

8. The method according to claim 6,
wherein the step of forming the second adsorption region is performed longer than the steps of adsorbing the second source gas and depositing the second silicon nitride film.

9. The method according to claim 6, wherein the steps of forming the second adsorption blocking region, adsorbing the second source gas and depositing the second silicon nitride film is made one cycle, and the one cycle is repeated multiple times.

10. The method according to claim 9,
wherein the substrate is placed on a surface of a turntable along a circumferential direction thereof, the turntable being provided in a chamber,
wherein a chlorine radical adsorption region capable of supplying the second chlorine radicals to the substrate, a first purge region capable of supplying the third purge gas to the substrate, a source gas adsorption region capable of supplying the second source gas to the substrate, a second purge region capable of supplying the fourth purge gas to the substrate, and a nitriding region capable of supplying the activated second nitriding gas to the substrate are provided above the turntable and along the circumferential direction of the turntable,
wherein the step of forming the second adsorption blocking region is performed by rotating the turntable a first predetermined number of times while supplying the second chlorine radicals in the chlorine radical adsorption region, the third purge gas in the first purge region, the fourth purge gas in the second purge region, the second source gas in the source gas adsorption region, and the activated second nitriding gas in the nitriding region to the substrate, and
wherein the steps of adsorbing the second source gas and depositing the second silicon nitride film are performed by rotating the turntable a second predetermined number of times while supplying the second chlorine radicals in the chlorine radical adsorption region, the third purge gas in the first purge region, the fourth purge gas in the second purge region, the second source gas in the source gas adsorption region, the activated second nitriding gas in the nitriding region.

11. The method according to claim 10, wherein the first predetermined number of times is greater than the second predetermined number of times.

12. The method according to claim 10, wherein the second predetermined number of times is one time.

13. The method according to claim 10, wherein an area of the adsorption blocking region is adjusted by the first predetermined number of times.

14. The method according to claim 10, wherein the chlorine radical adsorption region, the first purge region, the source gas adsorption region, the second purge region, and the nitriding region are arranged along a rotational direction of the turntable.

15. The method according to claim 10, wherein the step of forming the second adsorption blocking region comprises supplying the second chlorine radicals from a showerhead.

16. The method according to claim 1, wherein the step of forming the adsorption blocking region comprises supplying the chlorine radicals generated by a remote plasma generator.

17. The method according to claim 1, wherein the step of forming the adsorption blocking region comprises supplying the chlorine radicals generated by inductively coupled plasma.

18. The method according to claim 1, wherein the step of forming the adsorption blocking region comprises supplying the chlorine radicals generated by inductively coupled plasma.

19. The method according to claim 1, wherein the step of adsorbing the source gas comprises adsorbing dichlorosilane on the adsorption blocking region.

* * * * *